United States Patent
Rehwald et al.

(10) Patent No.: US 12,405,332 B2
(45) Date of Patent: Sep. 2, 2025

(54) COMBINED ACQUISITION AND REORDERING SCHEME FOR RECONSTRUCTING IMAGES WITH REDUCED MOTION ARTIFACTS

(71) Applicants: Siemens Healthineers AG, Forchheim (DE); Duke University, Durham, NC (US)

(72) Inventors: Wolfgang G. Rehwald, Chapel Hill, NC (US); Raymond J. Kim, Chapel Hill, NC (US); Enn-Ling Chen, Chapel Hill, NC (US); David C. Wendell, Durham, NC (US)

(73) Assignees: Siemens Healthineers AG, Forchheim (DE); Duke University, Durham, NC (US)

( * ) Notice: Subject to any disclaimer, the term of this patent is extended or adjusted under 35 U.S.C. 154(b) by 317 days.

(21) Appl. No.: 18/175,700

(22) Filed: Feb. 28, 2023

(65) Prior Publication Data
US 2023/0288509 A1   Sep. 14, 2023

Related U.S. Application Data

(60) Provisional application No. 63/268,712, filed on Mar. 1, 2022.

(51) Int. Cl.
| G01R 33/48 | (2006.01) |
| G01R 33/56 | (2006.01) |
| G01R 33/567 | (2006.01) |

(52) U.S. Cl.
CPC ..... *G01R 33/4818* (2013.01); *G01R 33/5602* (2013.01); *G01R 33/5676* (2013.01)

(58) Field of Classification Search
CPC ............ G01R 33/4818; G01R 33/5602; G01R 33/5676
See application file for complete search history.

(56) References Cited

U.S. PATENT DOCUMENTS

| | | |
|---|---|---|
| 8,311,612 B2 | 11/2012 | Rehwald et al. |
| 9,566,014 B2* | 2/2017 | Xu ................... G01R 33/56325 |
| 10,591,568 B2 | 3/2020 | Rehwald et al. |
| 2007/0010732 A1* | 1/2007 | DeYoe ................... A61B 5/377 600/410 |
| 2014/0303482 A1* | 10/2014 | Santini ............... G01R 33/5673 600/411 |
| 2018/0203086 A1 | 7/2018 | Rehwald et al. |

OTHER PUBLICATIONS

Polimeni et al. (2016), Reducing sensitivity losses due to respiration and motion in accelerated echo planar imaging by reordering the autocalibration data acquisition. Magn. Reson. Med., 75: 665-679. (Year: 2016).*

(Continued)

*Primary Examiner* — Gregory H Curran

(57) ABSTRACT

A method for reordering a segmented MRI pulse sequence includes synchronizing to a physiologic signal of a heart or vessel, to a respiratory signal, or to an external trigger source, and acquiring a plurality of data collecting segments as a contiguous block in a phase encoding direction such that lines of the plurality of data collecting segments are alternately acquired in a forward direction and a reverse direction for each consecutive data collecting segment.

24 Claims, 26 Drawing Sheets

(56) References Cited

OTHER PUBLICATIONS

Kim, Raymond J., et al. "Relationship of MRI delayed contrast enhancement to irreversible injury, infarct age, and contractile function." Circulation 100.19 (1999): 1992-2002.
Simonetti, Orlando P., et al. "An improved MR imaging technique for the visualization of myocardial infarction." Radiology 218.1 (2001): 215-223.
Edelman, R. R., et al. "Segmented turboFLASH: method for breath-hold MR imaging of the liver with flexible contrast." Radiology 177.2 (1990): 515-521.
Xue, Hui, et al. "Motion correction for myocardial T1 mapping using image registration with synthetic image estimation." Magnetic resonance in medicine 67.6 (2012): 1644-1655.
Kellman, Peter, et al. "Motion-corrected free-breathing delayed enhancement imaging of myocardial infarction." Magnetic Resonance in Medicine: An Official Journal of the International Society for Magnetic Resonance in Medicine 53.1 (2005): 194-200.
Serai, Suraj D., et al. "Newly developed methods for reducing motion artifacts in pediatric abdominal MRI: tips and pearls." American Journal of Roentgenology 214.5 (2020): 1042-1053.
Zaitsev, Maxim, Julian Maclaren, and Michael Herbst. "Motion artifacts in MRI: A complex problem with many partial solutions." Journal of Magnetic Resonance Imaging 42.4 (2015): 887-901.
Sievers, Burkhard, et al. "Rapid detection of myocardial infarction by subsecond, free-breathing delayed contrast-enhancement cardiovascular magnetic resonance." Circulation 115.2 (2007): 236-244.
Wildgruber, M., et al. "Inversion-recovery single-shot cardiac MRI for the assessment of myocardial infarction at 1.5 T with a dedicated cardiac coil." The British journal of radiology 85.1017 (2012): e709-e715.
Huber, Armin, et al. "Single-shot inversion recovery TrueFISP for assessment of myocardial infarction." American Journal of Roentgenology 186.3 (2006): 627-633.
Kellman, Peter, et al. "Phase-sensitive inversion recovery for detecting myocardial infarction using gadolinium-delayed hyperenhancement." Magnetic Resonance in Medicine: An Official Journal of the International Society for Magnetic Resonance in Medicine 47.2 (2002): 372-383.
Deshpande, Vibhas S., et al. "Reduction of transient signal oscillations in true-FISP using a linear flip angle series magnetization preparation." Magnetic Resonance in Medicine: An Official Journal of the International Society for Magnetic Resonance in Medicine 49.1 (2003): 151-157.
Bailes, D. R., et al. "Respiratory ordered phase encoding (ROPE): a method for reducing respiratory motion artefacts in MR imaging." J Comput Assist Tomogr 9.4 (1985): 835-838.
Usman, M., et al. "Free breathing whole-heart 3D CINE MRI with self-gated Cartesian trajectory." Magnetic resonance maging 38 (2017): 129-137.
Han, Fei, et al. "Self-gated 4D multiphase, steady-state imaging with contrast enhancement (MUSIC) using rotating cartesian K-space (ROCK): validation in children with congenital heart disease." Magnetic resonance in medicine 78.2 (2017): 472-483.
Jhooti, Permi, et al. "Hybrid ordered phase encoding (HOPE): an improved approach for respiratory artifact reduction." Journal of Magnetic Resonance Imaging 8.4 (1998): 968-980.
Busse, Reed F., and Stephen J. Riederer. "Steady-state preparation for spoiled gradient echo imaging." Magnetic Resonance in Medicine: An Official Journal of the International Society for Magnetic Resonance in Medicine 45.4 (2001): 653-661.
Henningsson, Markus, et al. "Whole-heart coronary MR angiography with 2D self-navigated image reconstruction." Magnetic resonance in medicine 67.2 (2012): 437-445.
Munoz, Camila, et al. "Motion corrected water/fat whole-heart coronary MR angiography with 100% respiratory efficiency." Magnetic resonance in medicine 82.2 (2019): 732-742.
Zeilinger, Martin Georg, et al. "3D Dixon water-fat LGE imaging with image navigator and compressed sensing in cardiac MRI." European Radiology 31.6 (2021): 3951-3961.
K. Bratis et al. "Image-navigated 3-dimensional late gadolinium enhancement cardiovascular magnetic resonance imaging: feasibility and initial clinical results" Journal of Cardiovascular Magnetic Resonance, 2017, 19:37, pp. 1-9.
M. Yui et al. "Motion Measurement using Echoes during SSFP dummy cycles for Whole-Heart MR Coronary Artery" Proc. Intl. Soc. Mag. Reason. Med., 14, 2006, pp. 2158.

* cited by examiner

COMBINED ACQUISITION AND REORDERING SCHEME FOR RECONSTRUCTING IMAGES WITH REDUCED MOTION ARTIFACTS

CROSS-REFERENCE TO RELATED APPLICATION(S)

This application claims priority under 35 U.S.C. § 119(e) to provisional U.S. patent application No. 63/268,712, filed Mar. 1, 2022, the entire contents of which are incorporated herein by reference.

TECHNICAL FIELD

Example embodiments relate to reordering segmented MRI pulse sequences.

BACKGROUND

Methods for reordering a segmented MRI pulse sequence include interleaved reordering and continuous reordering.

SUMMARY

One or more example embodiments may reduce image artifacts, such as ghosting, in resultant images.

At least one example embodiment provides a method for data acquisition combined with a matched reordering scheme for a segmented MRI pulse sequence.

At least one other example embodiment provides a method for generating images from raw k-space data acquired with segmented MRI pulse sequences which employ the disclosed reordering scheme.

At least one example embodiment provides a method for reordering data acquired with a segmented MRI pulse sequence, the method including synchronizing to a physiologic signal of a heart or vessel, to a respiratory signal, or to an external trigger source, and acquiring a plurality of data collecting segments each as a contiguous block in a phase encoding direction such that lines of the plurality of data collecting segments are alternately acquired in a forward direction and a reverse direction for each consecutive data collecting segment in the raw k-space.

According to at least one example embodiment, the method further includes acquiring a dummy segment prior to acquiring each data collecting segment using a same timing and flip angle as for the data collecting segment, and discarding the dummy segment.

According to at least one example embodiment, the acquiring the dummy segment includes acquiring the dummy segment such that a flip angle of the dummy segment equals the flip angle of the data collecting segment multiplied by the ratio of a number of lines of the data collecting segment to a number of lines of the dummy segment.

According to at least one example embodiment, the acquiring the dummy segment includes using an increasing flip angle ending at a flip angle used for acquiring the plurality of data collecting segments.

According to at least one example embodiment, the acquiring the dummy segment includes using a decreasing flip angle starting from a flip angle that is larger than a flip angle used for acquiring the plurality of data collecting segments.

According to at least one example embodiment, the method further includes acquiring a respiratory navigator echo.

According to at least one example embodiment, the method further includes acquiring a motion assessment and magnetic conditioning segment (MACS) prior to acquiring each of the plurality of data collecting segments, and reconstructing the MACS into a position reference image associated with a data collecting segment of the plurality of data collecting segments closest in time to the position reference segment.

According to at least one example embodiment, the acquiring the plurality of data collecting segments includes acquiring each data collecting segment of the plurality of data collecting segments R times, where R is greater than 1 and less than 10, comparing all associated position reference images to an optimal position reference image, determining a data collecting segment, of the R data collecting segments, associated with a minimum difference between the associated position reference image and the optimal position reference image, and discarding others of the R data collecting segments.

According to at least one example embodiment, the method further includes determining the optimal position reference image as an average of all acquired position reference images.

According to at least one example embodiment, the method further includes determining the optimal position reference image by subtracting the average image of all acquired position reference images from each acquired position reference image, then calculating the pixel sum of each of these difference images, and determining a position reference image associated with a minimum pixel sum of its difference image as the optimal position reference image.

According to at least one example embodiment, the method further includes obtaining a motion correction field for each data collecting segment of the plurality of data collecting segments based on the associated position reference image and the optimal position reference image, placing each data collecting segment that has not been discarded in a zero-filled k-space, transforming the k-space into a partial image of complex pixel values, performing a motion correction on the partial image by applying the associated motion correction field, and creating a final motion corrected image by combining a plurality of motion corrected partial images.

According to at least one example embodiment, the acquiring the plurality of data collecting segments includes acquiring a first data collecting segment of the plurality of data collecting segments for S seconds, creating an optimal position reference image for all data collecting segments by averaging all associated position reference images of the first data collecting segment, determining a first data collecting segment associated with a smallest difference between the associated position reference image and the optimal position reference image, discarding all other data collecting segments, repeating the acquiring each data collecting segment until a difference between the associated position reference image and the optimal position reference image is below a threshold, and ending the acquiring in response to all segments being acquired.

According to at least one example embodiment, the acquiring follows long-term averaging.

According to at least one example embodiment, the acquiring follows short-term averaging.

According to at least one example embodiment, the acquiring includes using a gradient echo sequence to acquire the plurality of data collecting segments and MACS.

According to at least one example embodiment, the acquiring includes using a steady state free pression sequence to acquire the plurality of data collecting segments and MACS.

According to at least one example embodiment, the acquiring includes using a turbo-spin echo sequence to acquire the plurality of data collecting segments and MACS.

According to at least one example embodiment, an inversion preparation is a spatially non-selective inversion recovery pulse.

According to at least one example embodiment, an inversion-preparation is a spatially selective inversion recovery pulse.

According to at least one example embodiment, an inversion-preparation is a wideband inversion recovery pulse.

According to at least one example embodiment, an inversion-preparation is a double-IR dark-blood preparation.

According to at least one example embodiment, the method further includes applying a magnetization transfer preparation before or after an inversion-preparation to produce a flow independent dark blood delated enhancement (FIDDLE) image.

According to at least one example embodiment, the method further includes applying a T2-preparation before or after an inversion-preparation to produce a flow independent dark blood delated enhancement (FIDDLE) image.

At least one example embodiment provides a method for providing a segmented MRI pulse sequence configured to acquire inversion recovery prepared data and reference data for reconstructing a phase sensitive inversion recovery (PSIR) image, the method including acquiring the inversion recovery prepared data by acquiring a plurality of data collecting segments each as a contiguous block in a phase encoding direction such that lines of the plurality of data collecting segments are alternately acquired in a forward order and a reverse order for each consecutive data collecting segment in raw k-space, and acquiring the reference data without magnetic preparation.

At least one example embodiment provides a device for reordering data acquired with a segmented MRI pulse sequence, the device including a memory and processing circuitry configured to cause the device to synchronize to a physiological signal of a heart or vessel, to a respiratory signal, or to an external trigger source, and acquire a plurality of data collecting segments each as a contiguous block in a phase encoding direction such that lines of the plurality of data collecting segments are alternately acquired in a forward direction and a reverse direction for each consecutive data collecting segment in the raw k-space.

At least one example embodiment provides a system for reordering data acquired with a segmented MRI pulse sequence, the system including an acquisition device and processing circuitry configured to cause the system to synchronize to a physiological signal of a heart or vessel, to a respiratory signal, or to an external trigger source, and acquire a plurality of data collecting segments each as a contiguous block in a phase encoding direction such that lines of the plurality of data collecting segments are alternately acquired in forward direction and a reverse direction for each consecutive data collecting segment in the raw k-space.

At least one example embodiment provides a device for reordering data acquired with a segmented MRI pulse sequence, the device including a means for synchronizing to a physiological signal of a heart or vessel, to a respiratory signal, or to an external trigger source, and a means for acquiring a plurality of data collecting segments each as a contiguous block in a phase encoding direction such that lines of the plurality of data collecting segments are alternately acquired in a forward direction and a reverse direction for each consecutive data collecting segment in the raw k-space.

At least one example embodiment provides a non-transitory computer readable storage medium storing computer executable instructions that, when executed, cause a device to perform a method for reordering data acquired with a segmented MRI pulse sequence, synchronizing to a physiologic signal of a heart or vessel, to a respiratory signal, or to an external trigger source, and acquiring a plurality of data collecting segments each as a contiguous block in a phase encoding direction such that lines of the plurality of data collecting segments are alternately acquired in a forward direction and a reverse direction for each consecutive data collecting segment in the raw k-space.

BRIEF DESCRIPTION OF THE DRAWINGS

Other objects and features of the present invention will become apparent from the following detailed description considered in conjunction with the accompanying drawings. The drawings, however, are only examples and schematic solely for the purpose of illustration and do not limit the present invention. In the drawings.

DETAILED DESCRIPTION

Figure 1A:
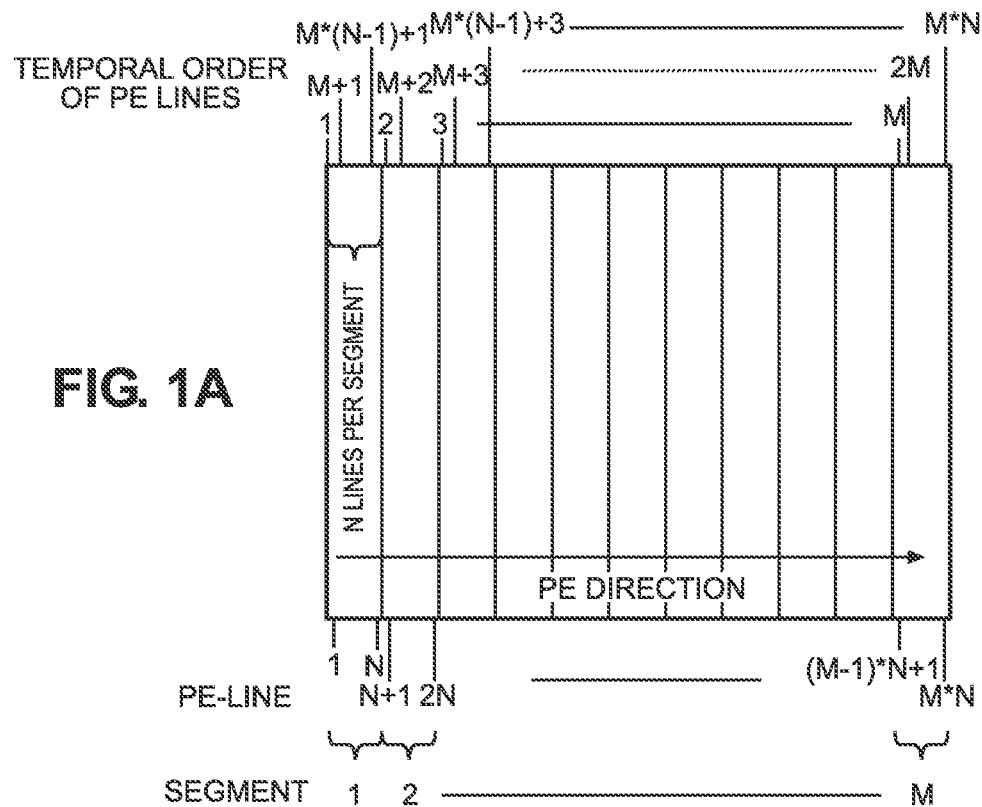
FIG. 1A illustrates an example of the interleaved reordering (INTR) reordering method.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

Detailed illustrative embodiments are disclosed herein. However, specific structural and functional details disclosed herein are merely representative for purposes of describing example embodiments. The example embodiments may, however, be embodied in many alternate forms and should not be construed as limited to only the embodiments set forth herein.

When used after the injection of a longitudinal recovery time (T1) shortening Gadolinium-based contrast agent, a segmented inversion-recovery (IR) prepared sequence, known as the "delayed enhancement" (DE) or "late Gadolinium enhancement" (LGE) sequence, produces T1-weighted images wherein viable (i.e., alive) myocardium appears dark and infarcted (i.e., dead) myocardium appears bright. The DE or LGE sequence is the workhorse of CMR and considered the gold standard for the detection of myocardial viability. It provides images with relatively high spatial and excellent temporal resolution and relatively high sensitivity to infarcted myocardium.

The amount of data needed to create such a high-resolution LGE image may be too large to be acquired in a single shot. The temporal resolution of such a single-shot image would be so poor (the readout duration would take so much time) that moving structures would be depicted blurred. For example, the intricate features of the heart may appear fuzzy. To avoid this problem, the data for one image may be collected by multiple shots, each of which acquires only a portion of the total raw data with the advantage of excellent (i.e., small) temporal resolution. This is known as a multi-shot or segmented acquisition.

The shots captured via the segmented acquisition are played in the same cardiac phase of different heartbeats. The acquired data is placed in the raw data space known as "k-space".

For example, if m lines are acquired per shot and n shots (heartbeats) are needed to collect all data, the fully acquired k-space will contain m*n lines. Note that unlike in computed tomography (CT) or X-ray, raw MRI data is not image data, but frequency-encoded data in k-space.

Once the k-space has been fully acquired, a two-dimensional Fourier Transform (FT) may be used to calculate the image from the raw data. The two directions in k-space are the phase encoding (PE) direction and the frequency encoding (FE) direction. One PE line is acquired during each time-to-repeat (TR, also known as echo spacing) and m TRs are played out in each shot.

For simplicity, example embodiments are discussed assuming that the FE data points along each PE line are acquired instantaneously. However, example embodiments are not to be limited thereto.

Different regions of k-space contain different image properties. The center of k-space contains image brightness and contrast information, whereas its edges contain sharpness and detail.

Both of the T1-recovery after an IR pulse and the signal saturation due to the data readout modulate raw data obtained without IR preparation and without readout saturation. This modulation provides image contrast, which is desired, but also creates pixel signal oscillation artifacts (PSOA) that express themselves as ghosting of object edges and general image inhomogeneity, which is undesirable.

These effects reduce the effective spatial resolution of the image by smearing and replicating the signal that belongs to one pixel of the real object across multiple pixels in its image. The severity of this effect depends on the specific modulation of the signal in k-space (in PE-direction). The smoother and more constant the modulation, the fewer artifacts are produced.

The modulation is a function of inversion time (TI), longitudinal recovery time constant (T1), readout flip angle, and "reordering". Therefore, different T1-species, for example normal versus infarcted myocardium, are subjected to different modulations.

As used herein, the term reordering describes the relationship between the temporal order of the acquired lines and their assignment to a specific PE location in k-space. It does not only affect the presence of artifacts and the T1 image contrast, but also the robustness of the data acquisition to motion and flow. The concept of reordering is extremely important for understanding the core of this application.

A reordering scheme known to those skilled in the art to not produce pixel signal oscillation artifacts (PSOAs) with segmented IR-prepared imaging is the so called "interleaved" reordering (INTR).

For INTR, the m lines acquired in each shot are not placed in a contiguous region in k-space but are spaced apart by skipping n−1 PE lines between each two acquired lines, so that in each shot (heartbeat) the entire k-space is traversed in the PE direction, but only m lines out of the total m*n lines are acquired. In the next shot this scheme is repeated, but the acquired PE lines are shifted by one PE step.

FIG. 1A shows the relationship between the temporal order in which the lines are acquired and the PE-line positions where they are placed for an INTR reordering method. After n shots all m*n lines are acquired. Lines from one shot are interleaved with lines from another shot. Of all known reordering schemes, INTR is the only one compatible with segmented IR-prepared imaging, as will be discussed in detail later.

Another reordering method is continuous reordering (CONR).

Figure 1B:
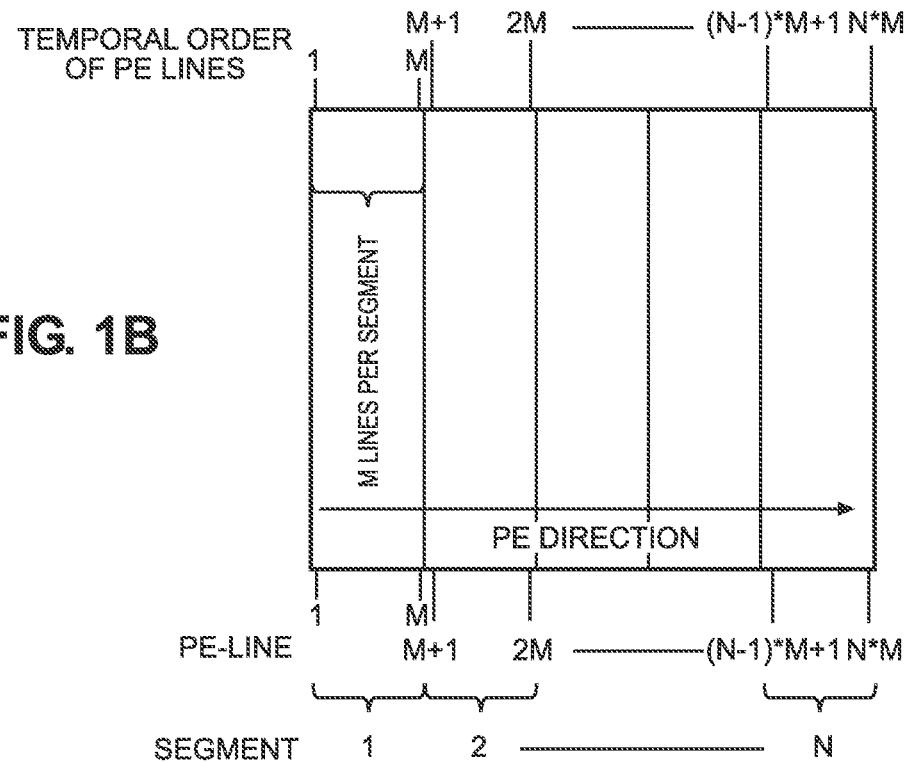
FIG. 1B illustrates an example of the continuous reordering (CONR) reordering method.

FIG. 1B illustrates an example of the CONR reordering method.

As shown in FIG. 1B, according to CONR, each shot acquires a set or segment of m contiguous PE lines. Each two segments from consecutive shots share one border. For segmented acquisition, CONR is typically used in the context of cine MRI, without any inversion preparation.

Figure 2:
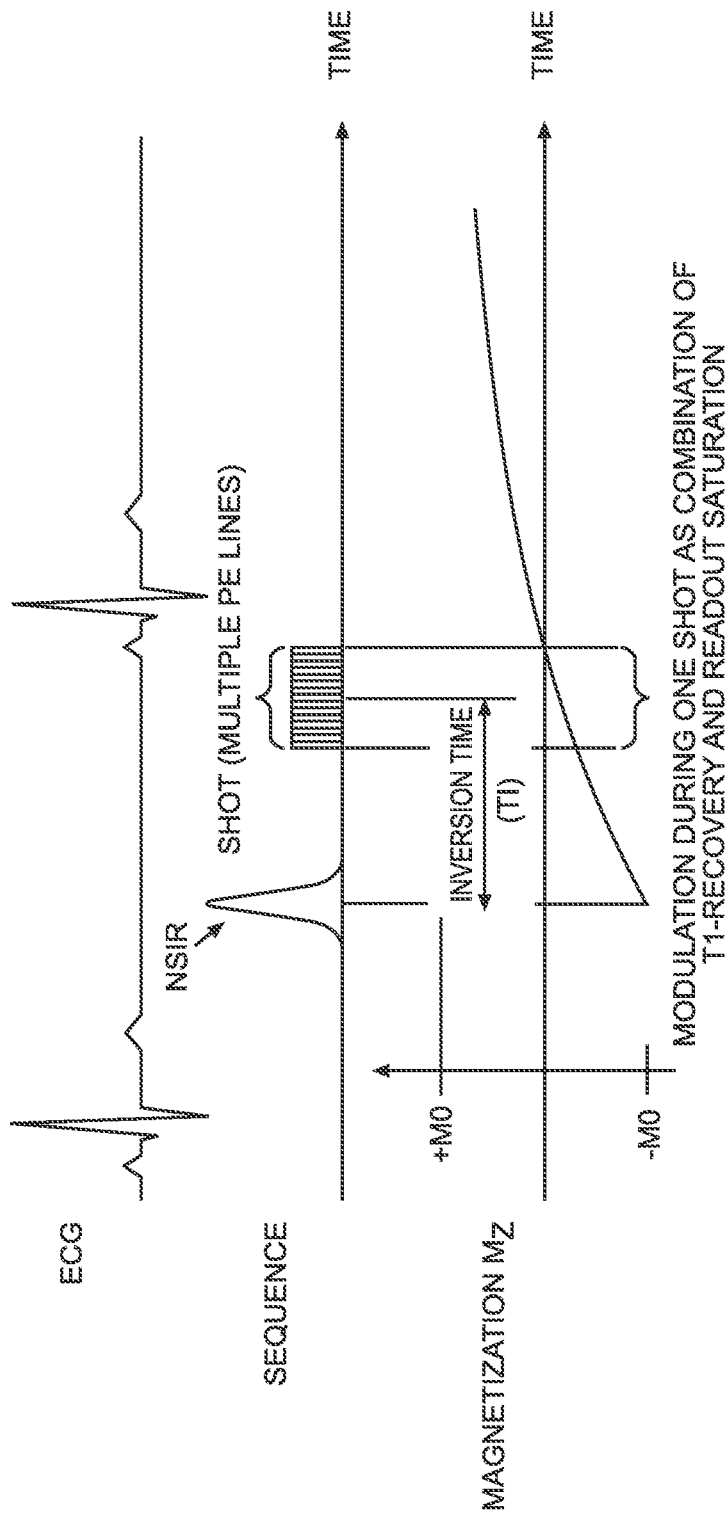
FIG. 2 illustrates how the T1-recovery after a non-selective IR (NSIR) pulse and the readout saturation creates a signal modulation in each shot.

FIG. 2 illustrates how the T1-recovery after a non-selective IR (NSIR) pulse and readout saturation creates a signal modulation in each shot. Each read-out PE line is multiplied by a different weighting factor which depends on the time that has passed since the NSIR pulse was applied, among other factors. Depending on the reordering, this may lead to different modulation functions across k-space. Note that the same principle applies independent of the specific type of inversion preparation. It can be a spatially non-selective, spatially selective, or chemically selective inversion; it can be a partial inversion or a spatially selective or non-selective saturation.

Figure 3A:
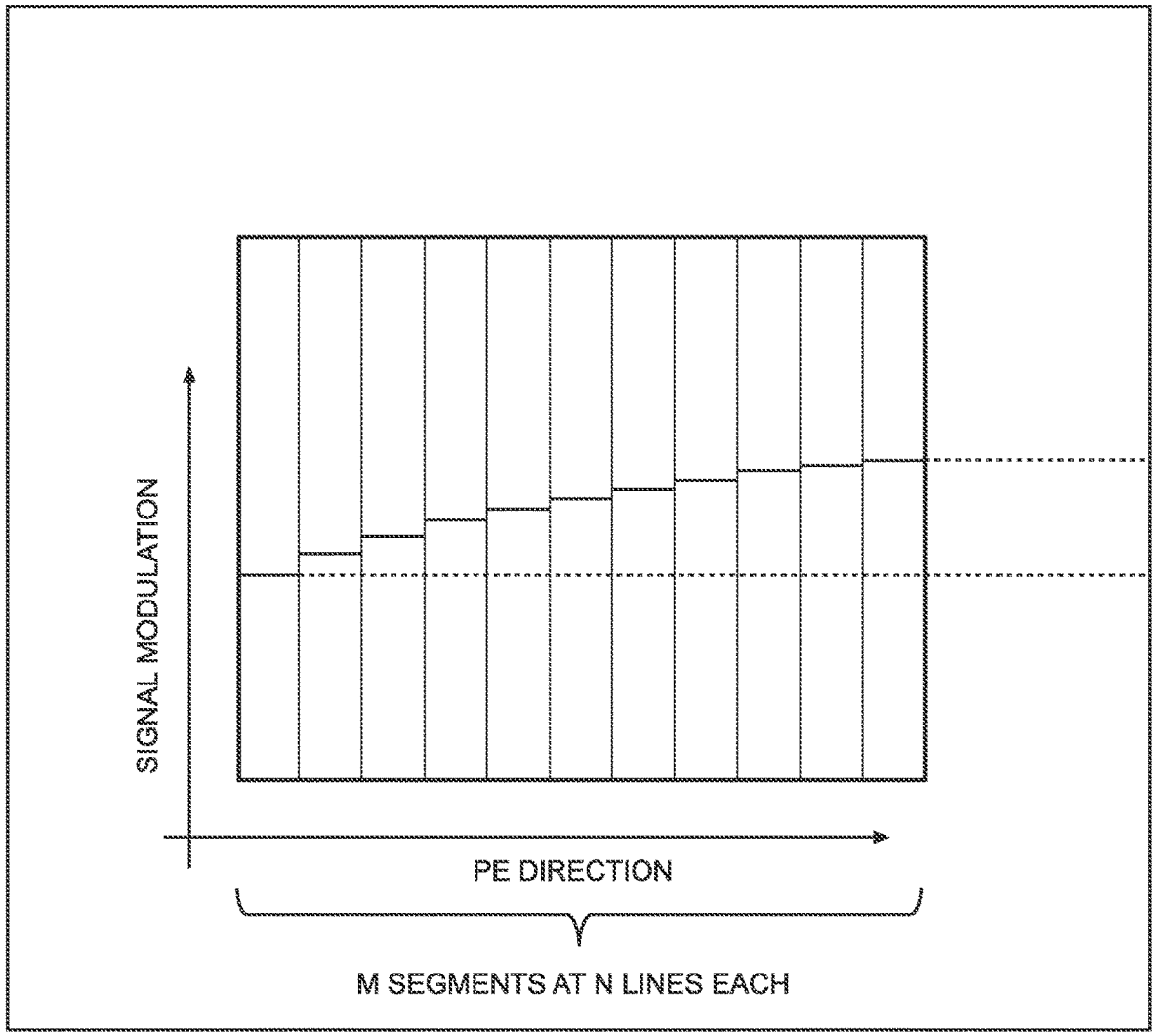
FIG. 3A illustrates an example of signal modulation in k-space created by INTR reordering.

FIG. 3A demonstrates that INTR distributes the modulation of each shot evenly across the entire PE direction of k-space, thereby creating a minimum possible slope of the modulation and suppressing and/or minimizing its discontinuities (amplitude differences) between adjacent segments. This modulation is optimal regarding image sharpness (best point spread function) and the avoidance of artifacts.

Figure 3B:
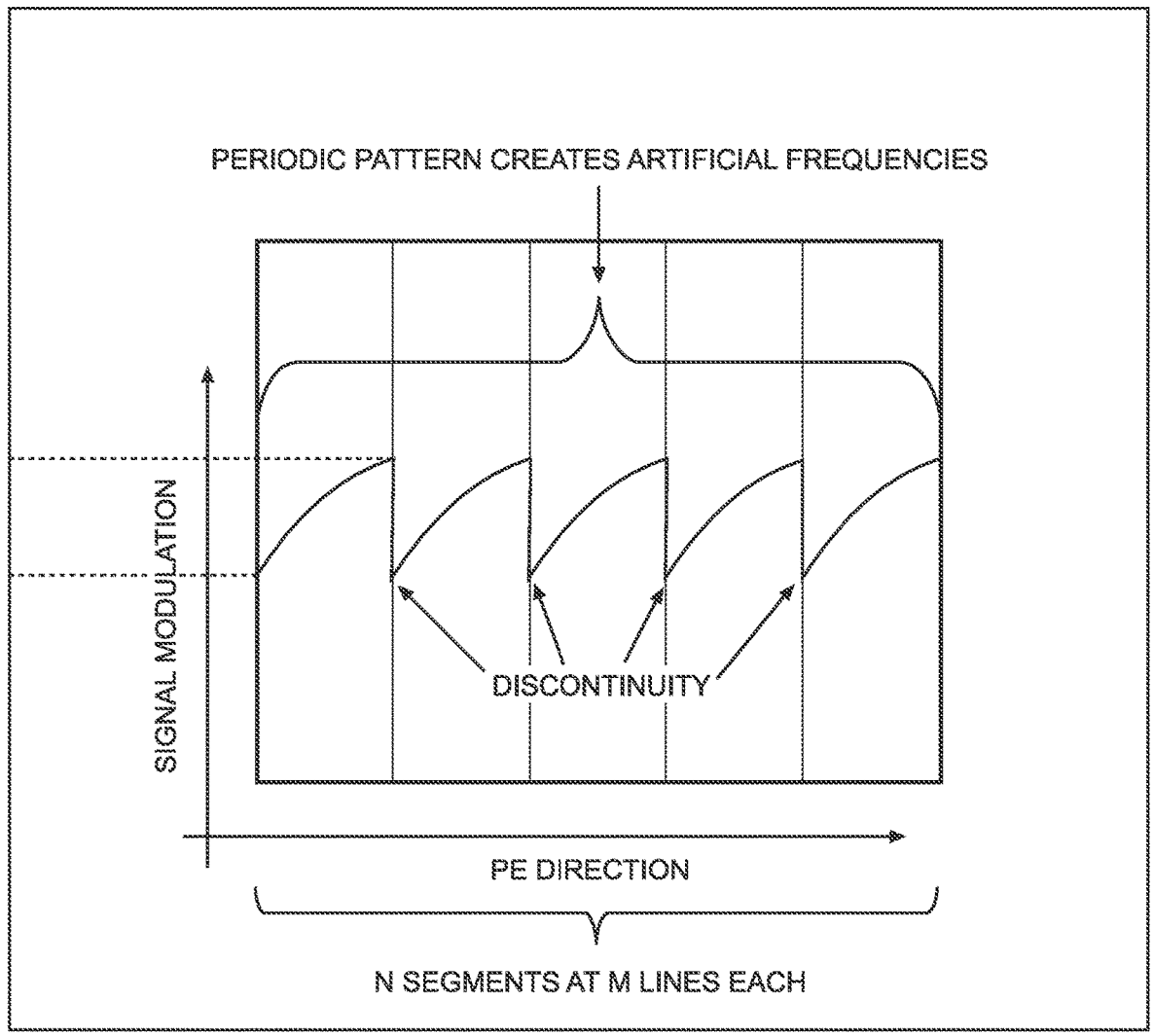
FIG. 3B illustrates an example of signal modulation in k-space created by CONR reordering.

As shown in FIG. 3B, CONR creates a sawtooth modulation which is periodic and thereby introduces artificial frequencies in k-space and concomitant replication of the imaged objects in the PE-direction, known as "ghosting".

Additionally, the discontinuities of the CONR modulation produce edge replication and smearing in the image.

Figure 4B:
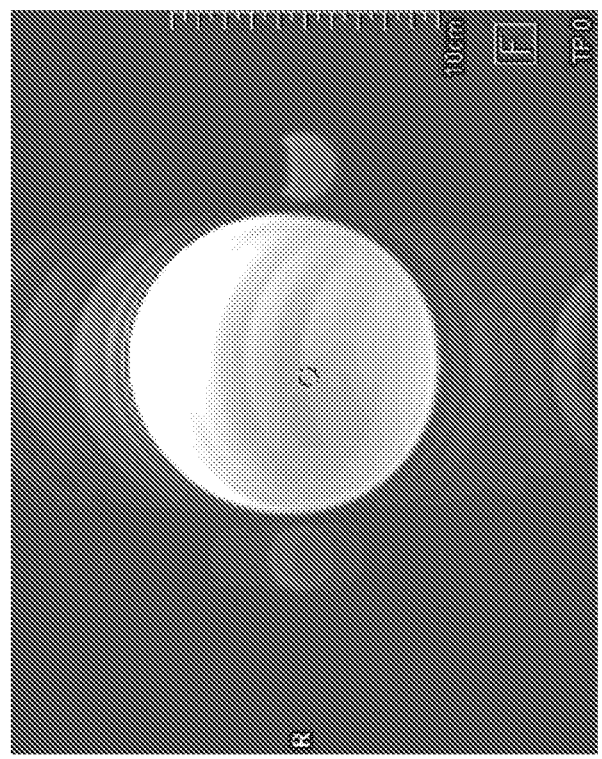
FIGS. 4A and 4B are examples of NSIR images produced by INTR and CONR.
Figure 4A:
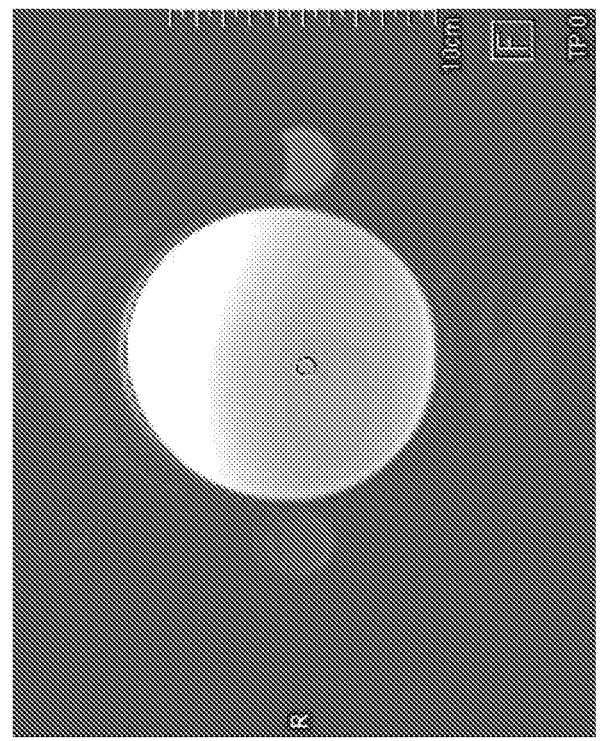

FIGS. 4A and 4B are examples of NSIR images of a short-T1 water bottle known as a phantom, produced by INTR and CONR, respectively.

As shown in FIG. 4A, an INTR NSIR-prepared image has very few artifacts and appears sharp, whereas its CONR counterpart shown in FIG. 4B exhibits signal aliasing also known as ghosting, and signal smearing. Therefore, for IR-prepared imaging only INTR is traditionally used.

Unfortunately, INTR is extremely sensitive to motion and flow. Even the slightest positional shifts between shots, for example an imperfect breath hold, may cause strong ghosting artifacts. Ghosting of the heart proper is also observed in case of arrythmia or poor ECG-triggering, where one or two shots out of the multi-shot data set have been acquired at a different cardiac phase than the remainder of the data.

Figure 5:
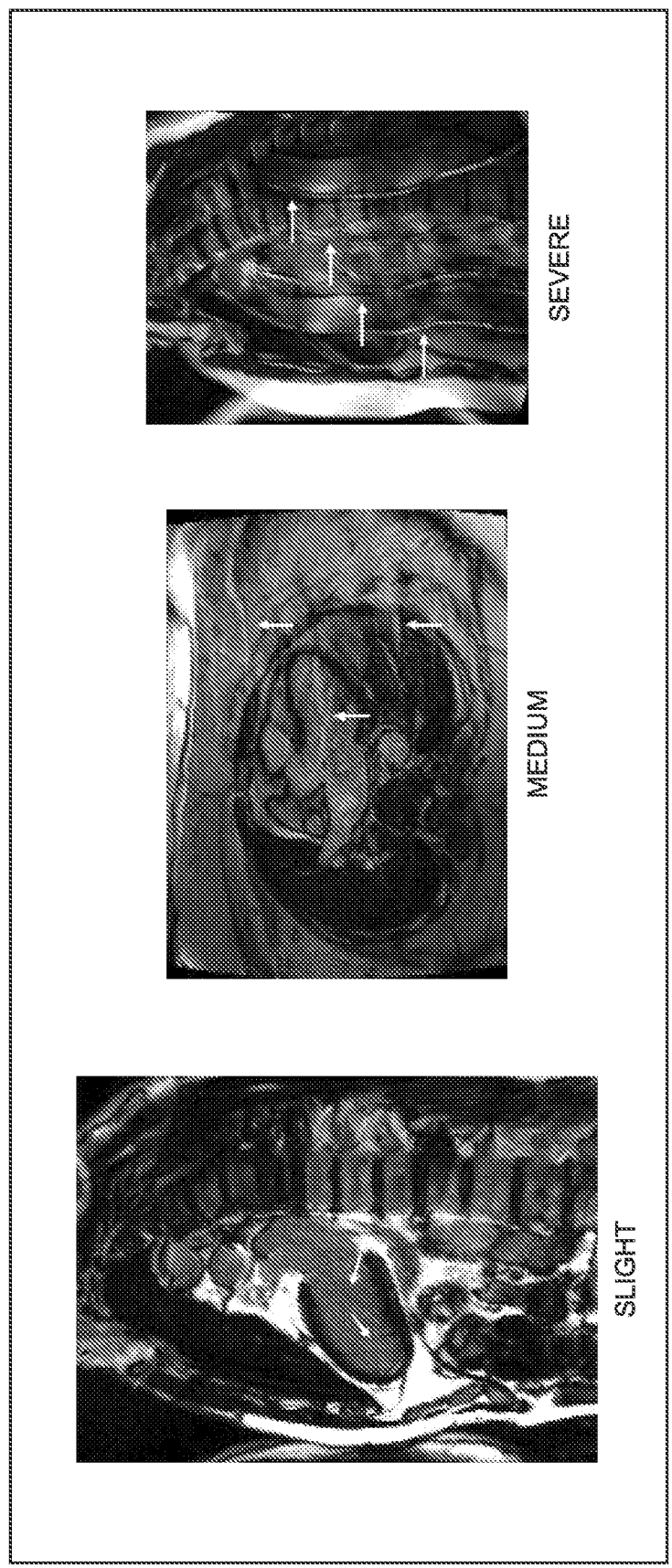
FIG. 5 illustrates patient examples with slight, medium, and severe ghosting.

FIG. 5 illustrates patient examples with slight, medium, and severe ghosting, indicated by the arrows. These artifacts can frequently impede clinical image interpretation.

Positional shift modulates the amplitude and phase of the raw data. If the positional shift is different for each shot and the multi-shot data is combined by interleaving in INTR, artificial frequencies are introduced into k-space, which are reflected as ghosting in the image. Correction of such data in k-space or image space as means or manner of ghosting removal may be relatively difficult or impossible due to the fact that the underlying motion is non-rigid.

Non-rigid motion correction works well for single shot images. However, it is incompatible with aliased images reconstructed from interleaved data. In aliased images, different sections of the imaged object (in the PE direction) are superimposed onto one another. Since each object section has experienced a slightly different non-rigid positional shift, no single motion correction of the aliased image can simultaneously correct all superimposed sections. Ghosting cannot be fully removed.

CONR may produce excellent image quality (IQ) when used without IR-preparation, for example in cine imaging of the heart. Even in poor breath holders, no ghosting or signal smearing is present because this reordering is very motion robust. It is only the combination of IR-preparation with CONR that causes artifacts, that are unrelated to motion.

The non-motion related problems of CONR are avoided by INTR, creating the problem of motion-sensitivity. Thus, both reordering schemes suffer from IQ problems that are different in origin.

Conventionally, no satisfactory solution exists to provide motion robustness to an IR-prepared segmented sequence needed for high-resolution LGE images. For example, the scanner operator may just use images with motion artifacts. If IQ is too poor in individual images, then these images may be reacquired after instructing the patient to better hold the breath. For patients that are unwilling or unable to do a better breath hold, for example those hard of hearing, this approach does not improve IQ. Running multiple averages during free breathing to reduce motion artifacts is another workaround in clinical imaging but yields suboptimal results. Shortening the breath hold duration by worsening the spatial or temporal resolution or the SNR also is frequently done. All these practical approaches defeat the purpose of getting high resolution high quality LGE images.

Some imaging centers use a belt to restrict a patient's range of breathing motion and thus the severity of motion artifacts, but this can be uncomfortable and is rarely done in Western countries.

One possible solution for producing motion-robust LGE images is to acquire them in single shots, which by default use a single continuous pass in k-space and are thereby motion-robust. However, single-shot images lack spatial resolution, temporal resolution, signal to noise ratio (SNR), or any combination thereof. This approach is therefore suboptimal.

A more advanced possible solution is the acquisition of multiple single shot images of higher spatial resolution afforded by higher parallel imaging acceleration, at the expense of SNR. These low-SNR single shot images may be motion-corrected and then averaged together to create one single shot image of higher SNR with the same high spatial resolution as each individual image. The disadvantage of this technique is that it takes much longer to acquire each image relative to an image obtained with a breath-held segmented acquisition. For example, this technique may require 12 to 16 averages with trigger pulse 2 (e.g., 24 to 36 heart beats) or trigger pulse 3 (e.g., 39 to 51 heart beats) to create one motion-corrected averaged image, whereas a segmented breath-held image would require 10 heartbeats or less. Also, it requires multiple times the energy compared to a segmented acquisition with the same spatial resolution. Furthermore, the non-rigid motion correction can be suboptimal, for example it may not account for through-plane motion.

Thus, there exist workarounds and partial solutions to address the poor IQ of segmented IR-prepared sequences in the presence of motion, but the obtained image quality is still worse than that of a breath-held, high-resolution IR-prepared segmented image.

Example embodiments disclose a novel reordering scheme, hereinafter referred to as partially reversed continuous (PRC) reordering. According to example embodiments a smooth modulation function may be created across the PE direction of k-space, which may suppress and/or minimize non-motion related artifacts, while the continuous nature of the employed reordering prevents the motion-and-flow-sensitivity of INTR.

PRC makes use of the observation that, in the setting of free breathing or imperfect breath holding, CONR known from cine MRI does not create ghosting artifacts, whereas INTR does. Since INTR currently is the only reordering method to prevent non-motion related artifacts in segmented IR-imaging, there exists no prior art that avoids both IR-related and motion-induced artifacts. PRC solves this problem by overcoming the incompatibility of CONR and segmented IR-imaging while preserving the motion robustness of CONR. Example embodiments combine a novel reordering scheme and the application of a dummy segment (DUS) prior to the data-collecting segment (DCS).

The PRC scheme, according to example embodiments, will be explained initially with regard to FIG. 6.

Figure 6:
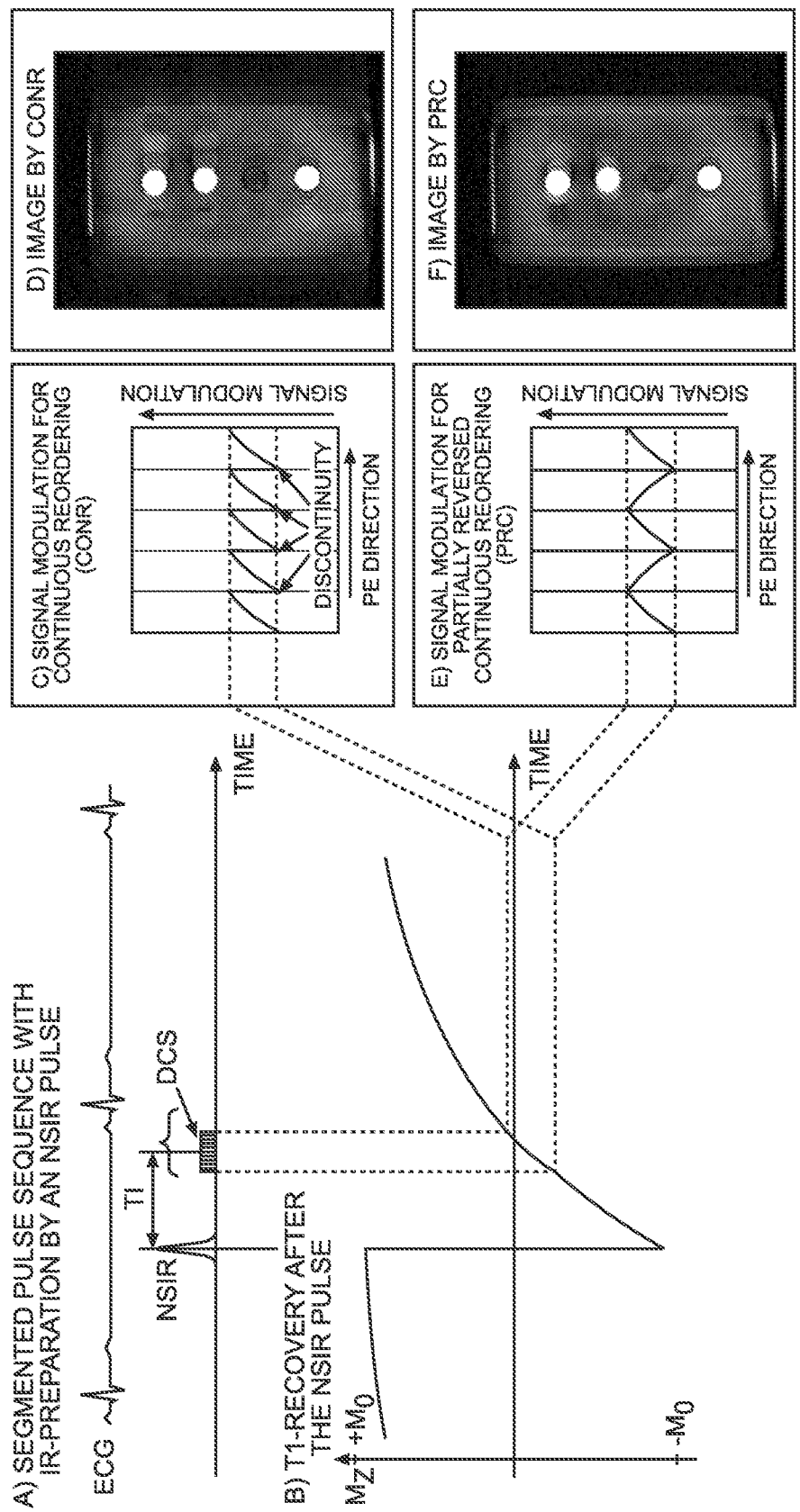
FIG. 6 illustrates the effect of CONR (section c) and of partially reversed continuous reordering (PRC) (section e) on the k-space modulation function and the resulting images (sections d and f, respectively), according to example embodiments.

Referring to FIG. 6, at section (a), a diagram of a segmented IR pulse sequence with an NSIR pulse and a DCS is shown. The DCS is timed so that its center occurs at time TI after the NSIR pulse and the DCS occurs in diastole (see ECG trace shown above the pulse sequence).

At section (b) in FIG. 6, a resulting T1 recovery curve is shown. The resulting T1 recovery curve includes the effect of both the NSIR pulse and the signal saturation of the readout of the DCS.

At section (c) in FIG. 6, a signal modulation is shown resulting from application of CONR. As shown, when applying the CONR scheme its saw-tooth pattern is apparent causing signal smearing and ghosting in the image. This is shown in FIG. 6 at section (d).

Section (e) in FIG. 6 shows signal modulation for PRC according to example embodiments. As shown, PRC removes the discontinuities, and cuts the fundamental frequency of the modulation in half, by reversing the read-out direction of every other segment. This leads to fewer artifacts in the PRC image shown at section (f) in FIG. 6.

Figure 7:
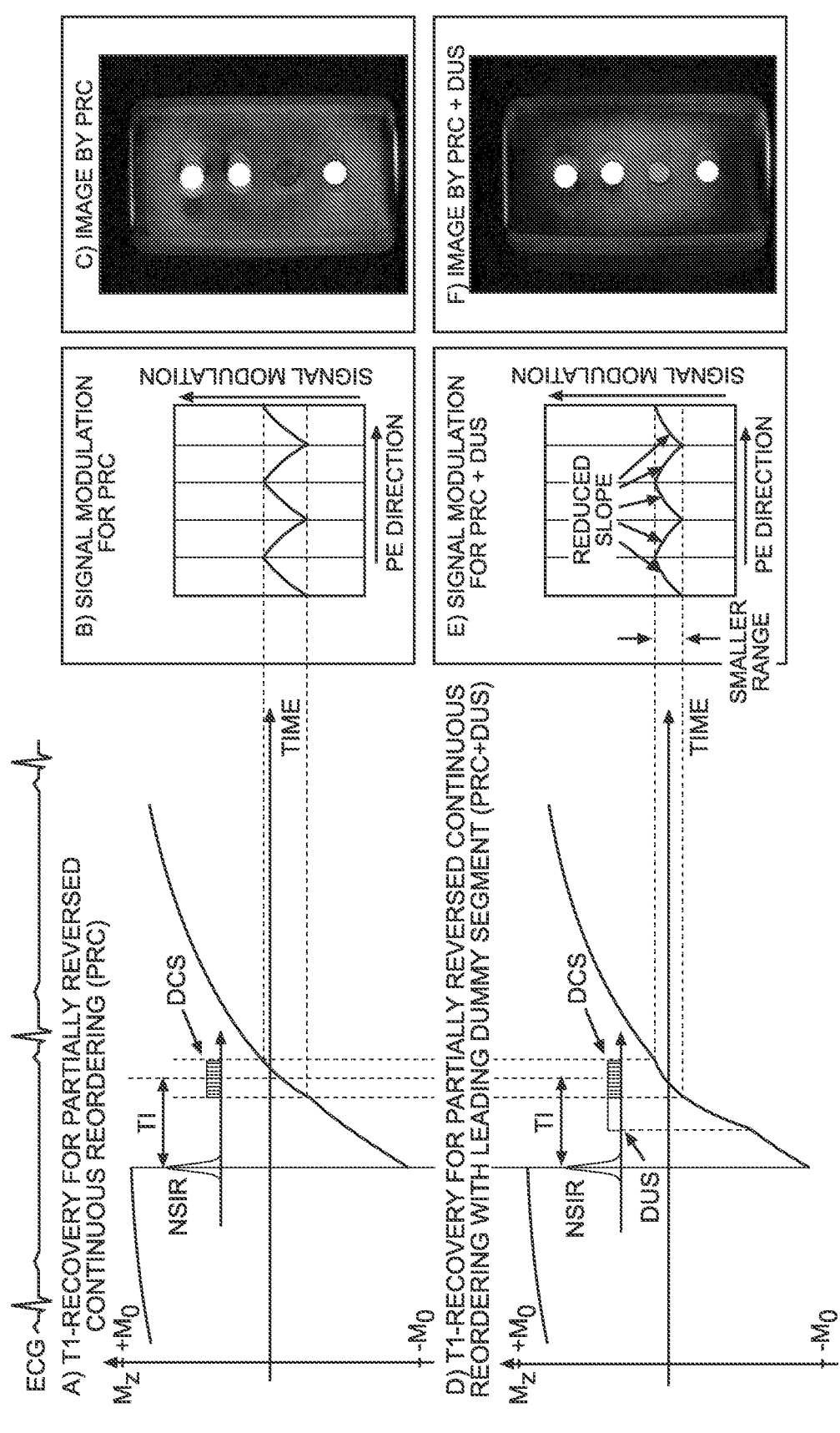
FIG. 7 illustrates the effect of including a dummy segment (DUS) prior to the data collection segment with PRC, its k-space modulation function in the absence and the presence of a DUS (sections b and e, respectively) and the resulting images (sections c and f, respectively), according to example embodiments.

FIG. 7 illustrates an effect of applying a dummy segment prior to the data collection segment, according to example embodiments.

Referring to FIG. 7, section (a) shows the diagram of the segmented IR pulse sequence with an NSIR pulse and the T1 recovery curve after the NSIR pulse. Section (b) shows the modulation by PRC, and section (c) shows the resulting image. Sections (b) and (c) in FIG. 7 are the same as sections (e) and (f) in FIG. 6.

Section (d) in FIG. 7 shows the modulation caused by placing a dummy segment (DUS) prior to the DCS. As shown in section (d), the DCS section of the T1 recovery curve has a smaller slope than that shown in section (a). Consequently, the modulation function, shown in section (e), of the PRC scheme combined with DUS (PRC+DUS) may have a reduced slope and a smaller dynamic range compared to PRC without DUS, resulting in less smearing and fewer artifacts in the resulting image, as shown in section (f).

Figure 8:
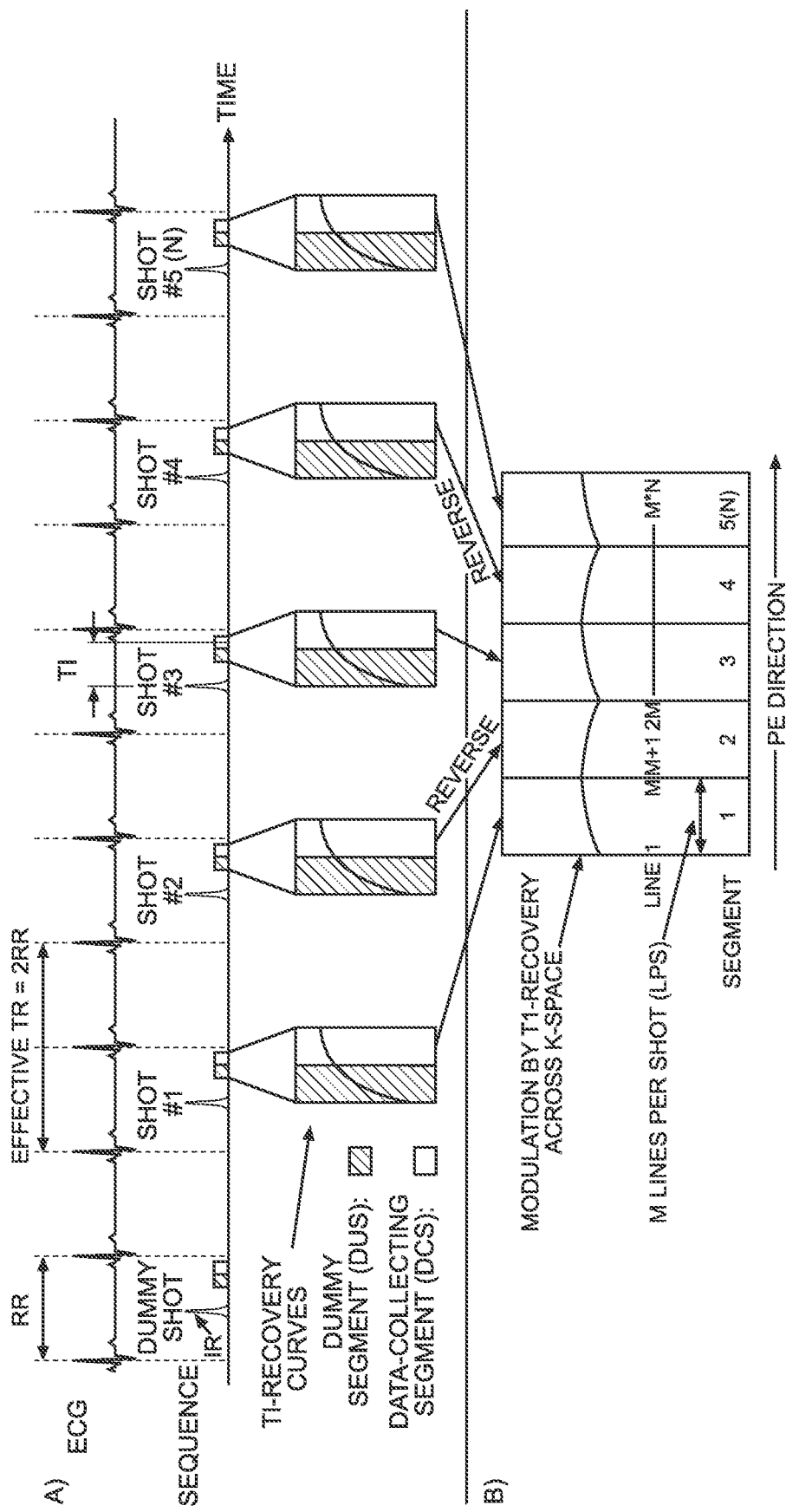
FIG. 8 illustrates an example pulse sequence according to PRC+DUS in the top section (section (a)) and the resulting k-space modulation in the bottom section (section (b)).

FIG. 8 illustrates an example of a pulse sequence according to PRC+DUS in the top section (section (a)) and the resulting k-space modulation in the bottom section (section (b)).

As may be appreciated in FIG. 8, the recovery curve is flatter for the DCS than the DUS part (grey shaded). In this example, an ith shot provides an ith segment. However, example embodiments are not limited thereto. For example, any relationship between shot and segment may be possible.

The readout direction of the even numbered shots shown in FIG. 8 is reversed (going from higher to lower lines in k-space). However, example embodiments are not limited thereto. For example, the direction of the odd shots may be reversed instead.

The example shown in FIG. 8 shows a trigger pulse of 2, meaning that every second heartbeat is used for signal recovery so that the effective repetition time $TR_{eff}$ equals two RR-intervals. However, example embodiments are not limited thereto. For example, any other trigger pulse could be used.

The first two RR-intervals shown in FIG. 8 are spent on a dummy shot and associated recovery heartbeat. This is typically done in segmented pulse sequences to ensure that all DCS are in steady state, meaning they all undergo the same T1-recovery. However, according to example embodiments, this may be optional since the DUS may serve the purpose of creating the steady state. Note that the dummy shot in the first heartbeat is not to be confused with the dummy segments that are part of the PRC+DUS method.

Figure 9A:
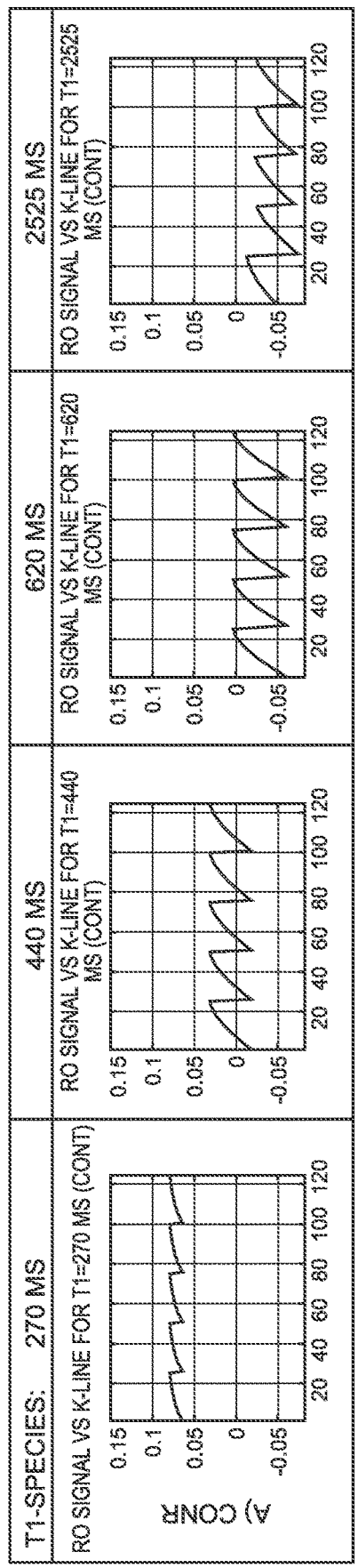
FIGS. 9A-9C are simulated k-space modulation functions for four discrete T1-times according to CONR, PRC, and PRC+DUS, respectively.
Figure 9B:
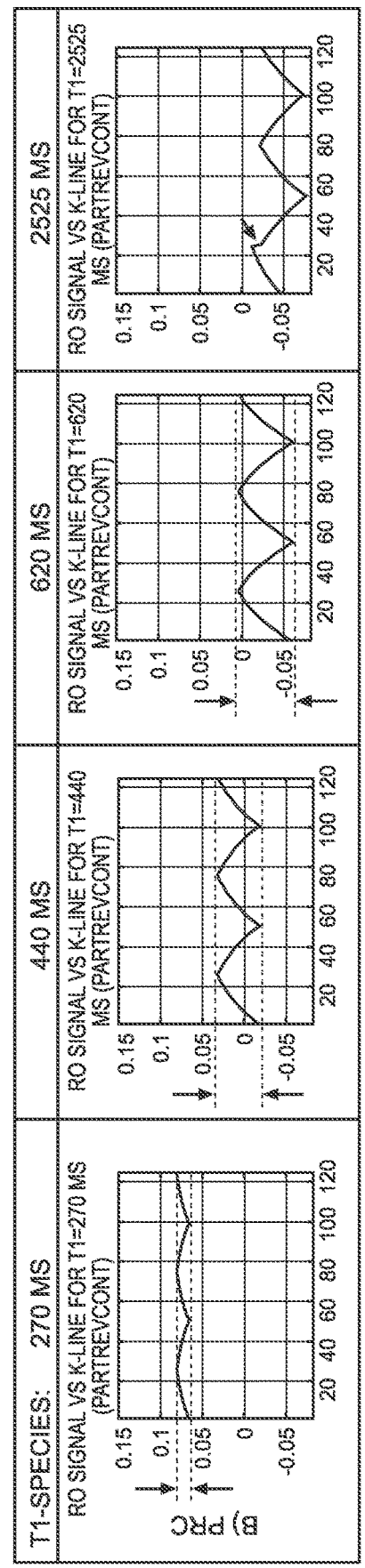
Figure 9C:
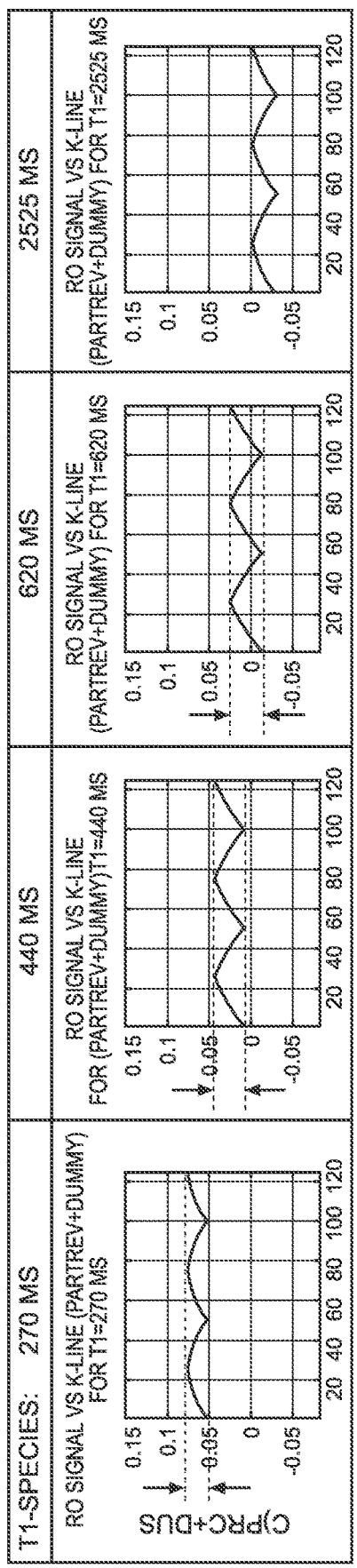

FIGS. 9A-9C are simulated k-space modulation functions for four discrete T1-times according to CONR, PRC, and PRC+DUS, respectively.

Referring to FIGS. 9A-9C, the four discrete T1-times shown are T1-times typically occurring in a delayed enhancement scan, ranging from 270 ms (fat) over 440 ms (infarct), 620 ms (normal myocardium) to 2525 ms (pleural or pericardial effusion).

Referring to FIG. 9A, the known saw tooth pattern of CONR can be appreciated for all T1 species.

FIG. 9B shows a simulated k-space modulation according to PRC. As may be appreciated by a comparison to the k-space of CONR shown in FIG. 9A, FIG. 9B shows the advantageous absence of the discontinuities and the halved fundamental frequency, but the same dynamic range.

Additionally, a modulation discontinuity occurs for the longest T1 species (2525 ms) as indicated by the arrow.

Referring to FIG. 9C, k-space modulations produced according to PRC+DUS (except for 270 ms) are flatter, and their dynamic range is reduced compared to the PRC. There is no modulation discontinuity of the longest T1 species. Both observations indicate better IQ of PRC+DUS, as will be seen later with regard to FIGS. 11 and 12.

For 270 ms, PRC+DUS has a slightly larger dynamic range than PRC alone, which may indicate worse IQ for PRC+DUS. This is not the case because the average value of this modulation is higher than for the modulations of all other T1-species so that the relative oscillations are small for both PRC and PRC+DUS.

Employment of a DUS before every DCS, according to example embodiments, is particularly useful in a real patient setting where no two RR-intervals are of exactly the same duration and ECG triggers can be missed. This leads to variable effective TR values resulting in different signal levels at the beginning of each DCS and thus discontinuities in the modulation functions of the PRC method.

Figure 10A:
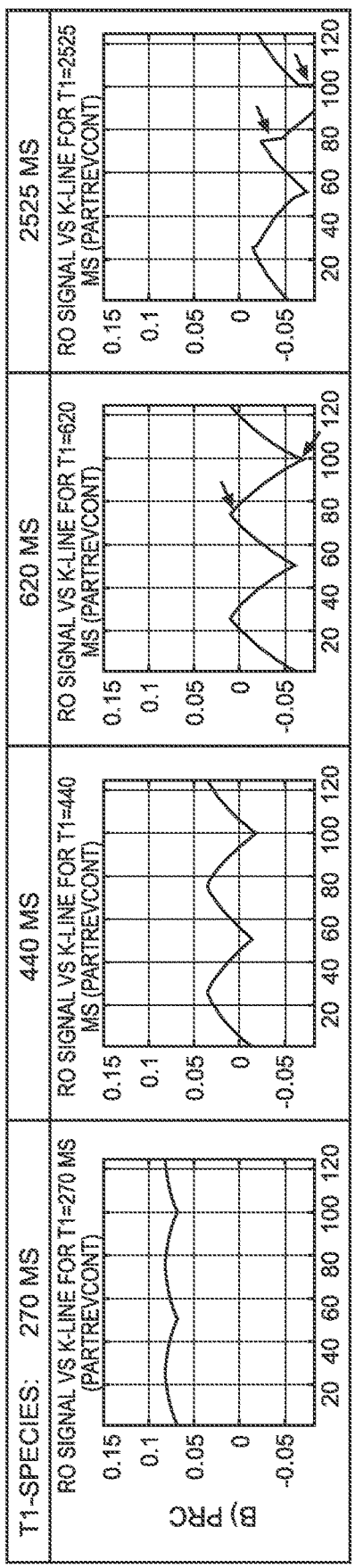
FIGS. 10A and 10B are simulated k-space modulation functions for a simulated variable heart rate during data acquisition, for four discrete T1-times according to PRC and PRC+DUS, respectively.
Figure 10B:
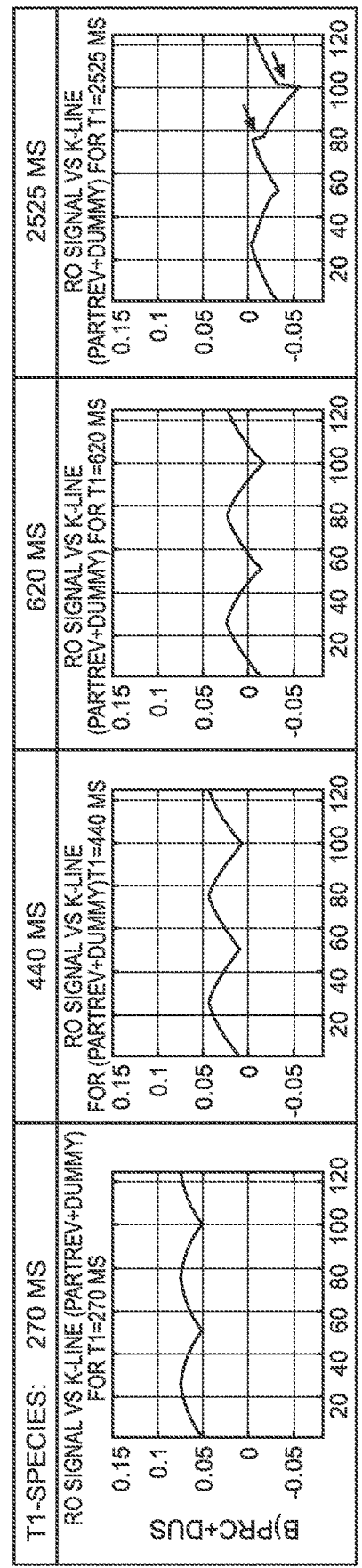

This may be seen in FIGS. 10A-10B which illustrate simulated k-space modulation functions for four discrete T1 times according to PRC and PRC+DUS. In FIGS. 10A and 10B, a variable RR was simulated for calculating the amplitude modulation.

Referring to FIG. 10A, as indicated by the arrows, discontinuities are observed for the T1 of 620 ms (minor) and for T1 of 2525 ms (substantial discontinuities).

As shown in FIG. 10B, by applying PRC+DUS, according to example embodiments, to the same series of RR-intervals the discontinuities for the T1 of 620 ms are completely (or substantially) prevented and they are significantly reduced for the T1 of 2,525 ms.

Note that an entire DUS including L readout pulses may be replaced by a smaller number of readout pulses with a higher flip angle. For example, instead of L pulses with flip angle alpha, ½ L pulses with flip angle 2*alpha could be played as DUS resulting, to first order, in the same flattened modulation functions and robustness towards varying RR-intervals. Other flip angle schemes are possible, for example a ramped-up flip angle with L or fewer pulses. These schemes allow a shorter minimum TI and acquisition window, and reduced SAR.

Figure 11:
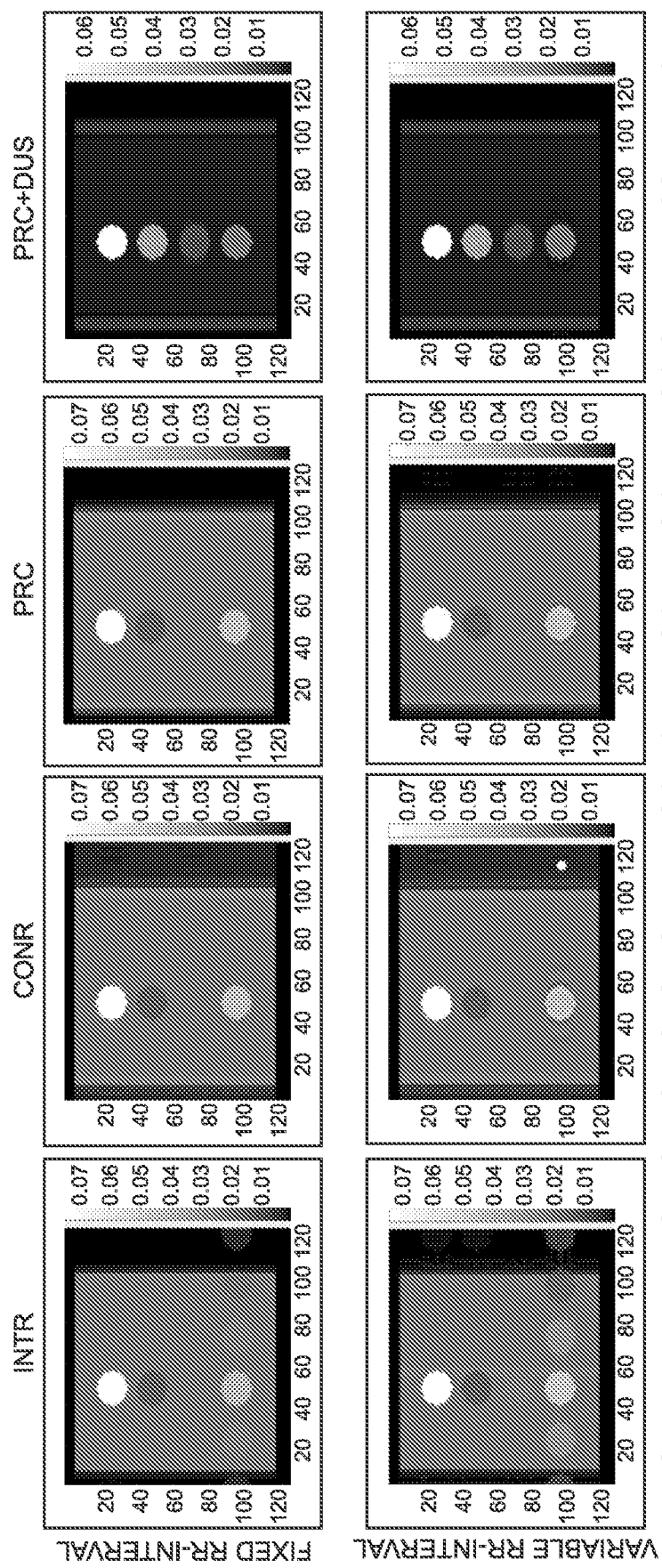
FIG. 11 shows images created by the simulations according to FIGS. 9A-10B, for a simulated fixed heart rate (fixed RR interval) in the top row and simulated variable heart rate (variable RR interval to mimic natural variations) in the bottom row. All images were simulated with the same inversion time (TI).

FIG. 11 shows images created by the simulations according to FIGS. 9A-10B.

Referring to FIG. 11, a fixed RR (1000 ms) was used for the top row of images and a variable RR of FIGS. 10A-10B was used for the bottom row of images.

The images in FIG. 11 produced by INTR show the typical long T1 ghosting and additional artifacts for variable RR-intervals in the lower row. The images in FIG. 11 produced by CONR show the known smearing and test tube edge ghosting for the fixed RR interval, but hardly increased artifacts for the variable RR.

Artifacts are reduced but still visible in the images in FIG. 11 produced by PRC, which are again very similar for fixed and variable RR intervals.

As shown in FIG. 11, for all T1 test tubes, PRC+DUS shows the fewest artifacts for fixed as well as variable RR-intervals. IQ is approximately the same for fixed and variable RR-intervals. Note that the image contrast for PRC+DUS is different from that of the other methods, as seen by the different image intensity of the test tubes acquired with PRC+DUS compared to the PRC, CONR or INTR. All methods used the same TI of 330 ms. This is an expected and non-limiting behavior due to the magnetic conditioning by the DUS.

Figure 12:
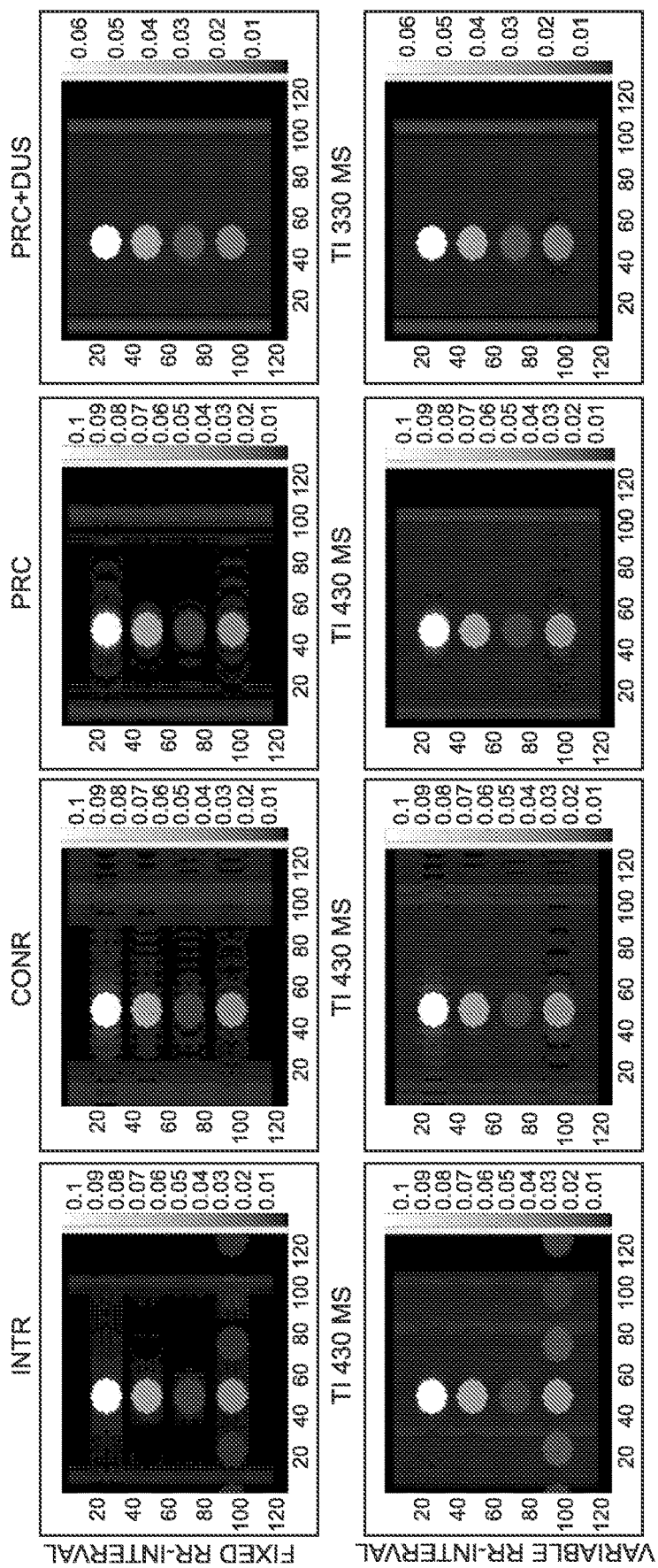
FIG. 12 shows images created by the simulations according to FIGS. 11A-11B, but the PRC+DUS images used a shorter TI to create a similar image contrast as for INTR, CONR, and PRC.

FIG. 12 shows images created by the simulations according to FIGS. 9A-10B using a different TI for PRC+DUS than for the other methods.

Referring to FIG. 12, matched image contrast between PRC+DUS and all other methods can be obtained by using a shorter TI of 330 ms for PRC+DUS and a longer TI of 430 ms for the other methods. The images shown in FIG. 12 show the same favorable IQ of PRC+DUS as FIG. 11 and additionally the matched image contrast between all methods. Since PRC+DUS allows for short TI values, using a shorter TI to mimic the contrast of INTR does not limit its general applicability including for short TI values.

Figure 13:
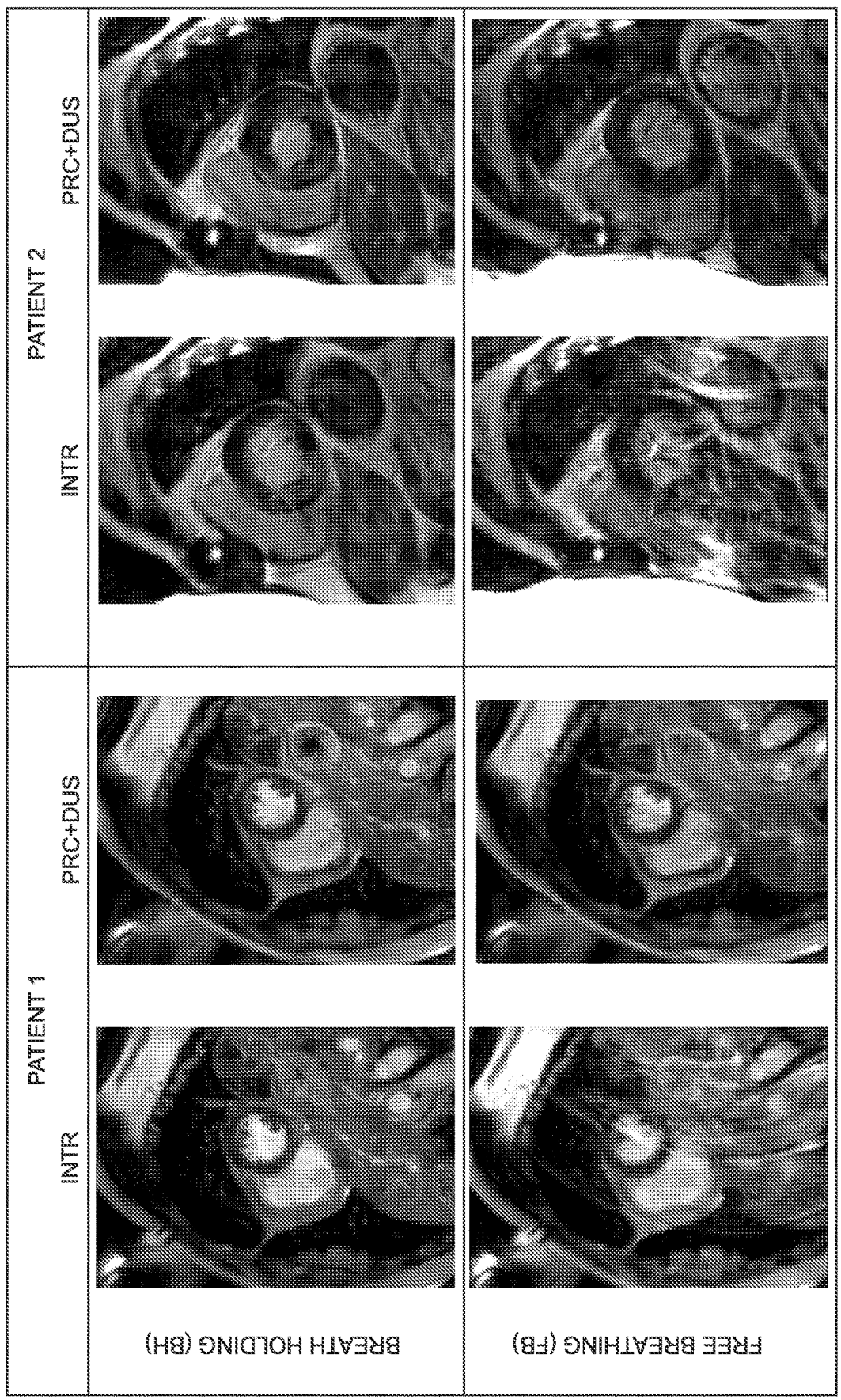
FIG. 13 shows example images of two patients taken using INTR and PRC+DUS, while breath holding (top row) and while free breathing (bottom row).

FIG. 13 shows example images of two patients taken using INTR and PRC+DUS.

Referring to FIG. 13, a general good IQ and motion robustness of PRC+DUS may be seen when compared with INTR.

For patient 1, breath holding leads to identical IQ between INTR and PRC+DUS. When free breathing, INTR shows that the known chest-wall ghosting significantly degrades IQ, whereas PRC+DUS provides diagnostic IQ.

For patient 2, IQ of INTR and PRC+DUS is diagnostic for breath holding. INTR shows the frequently observed faint ghosting of interfaces between the heart and surrounding structures, presumably due to a missed trigger, whereas PRC+DUS has slight signal smearing. During free breathing, INTR IQ becomes non-diagnostic due to the many ghosts of chest fat and other structures, whereas PRC+DUS provides diagnostic IQ even under these conditions.

Example embodiments are compatible with the Phase Sensitive IR (PSIR) feature known from the standard delayed enhancement (LGE) sequence.

Figure 14:
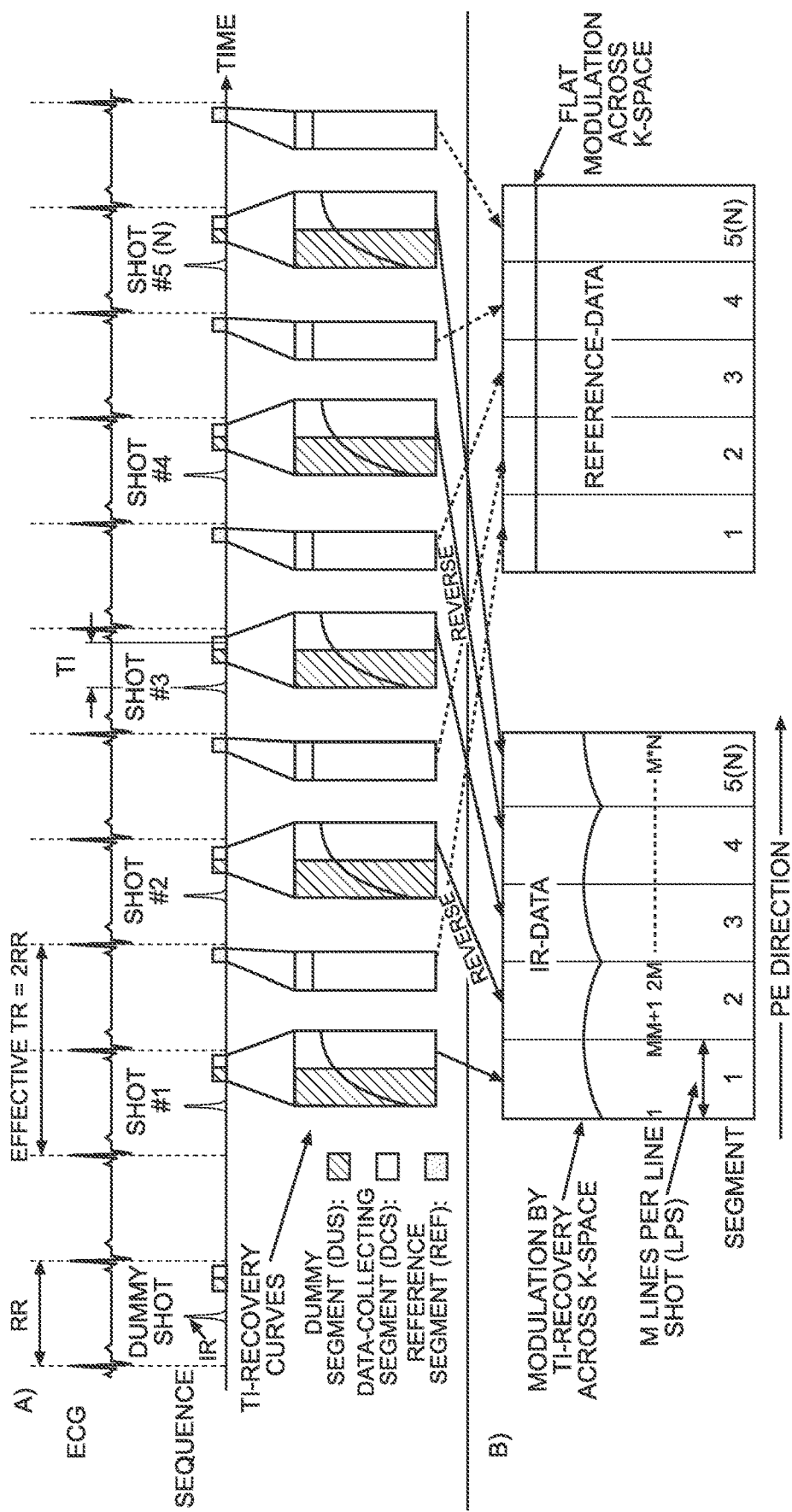
FIG. 14 shows an example implementation of PRC+DUS with PSIR reference acquisitions, according to example embodiments.

FIG. 14 shows an example implementation of PSIR with the PRC+DUS, according to example embodiments.

Referring to section (a) of FIG. 14, the heartbeats containing the NSIR pulse use the PRC+DUS scheme. In the recovery beats a low-flip angle PSIR reference readout (REF) is played. Both DCS and PSIR REF are acquired in the same cardiac phase, but in different heartbeats. Note that this PSIR REF readout shall not be confused with the position reference readout that will be presented later in this document.

CONR, reversed CONR and PRC are all compatible with PSIR, because the magnetization in the recovery heartbeats has mostly recovered at the time of PSIR REF acquisition, so that the modulation in each PSIR REF segment is basically flat. The PSIR REF acquisition resembles the case of cine MRI where the CONR scheme works very well due to the absence of any inversion. FIG. 14 shows the modulation functions for the IR data and reference data at section (b).

Figure 15:
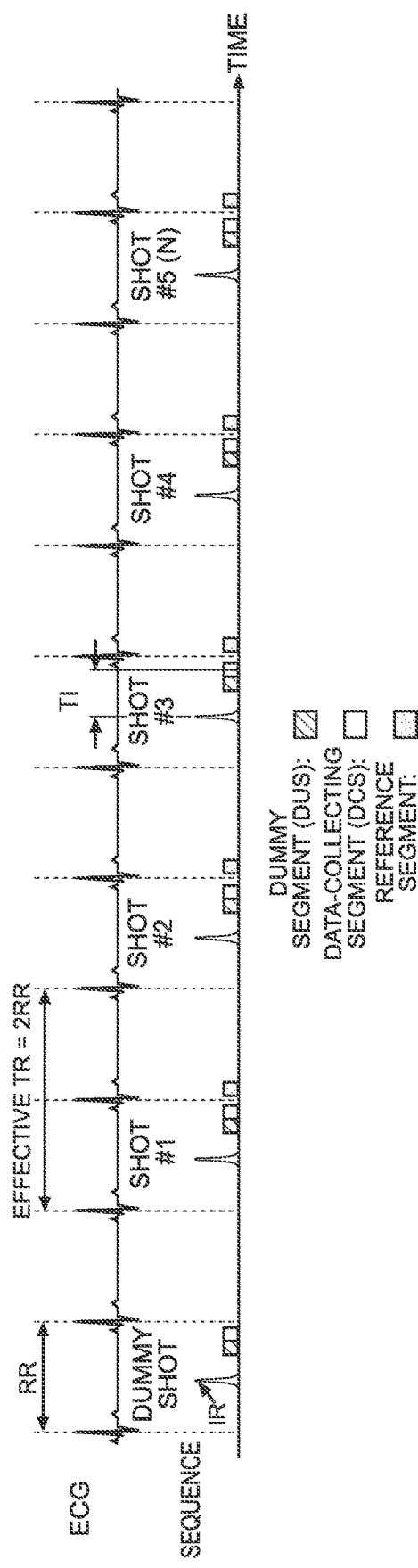
FIG. 15 shows an example according to FIG. 14 with the modification of moving the PSIR reference acquisitions right after the R-waves following the data collecting segments, according to example embodiments.

FIG. 15 shows an example of PRC+DUS with a modified PSIR REF acquisition. Unlike in FIG. 14 the PSIR REF acquisition is executed at the R-wave immediately following the DCS, as disclosed in U.S. patent application Ser. No. 15/623,511, incorporated herein by reference in its entirety.

Figure 16:
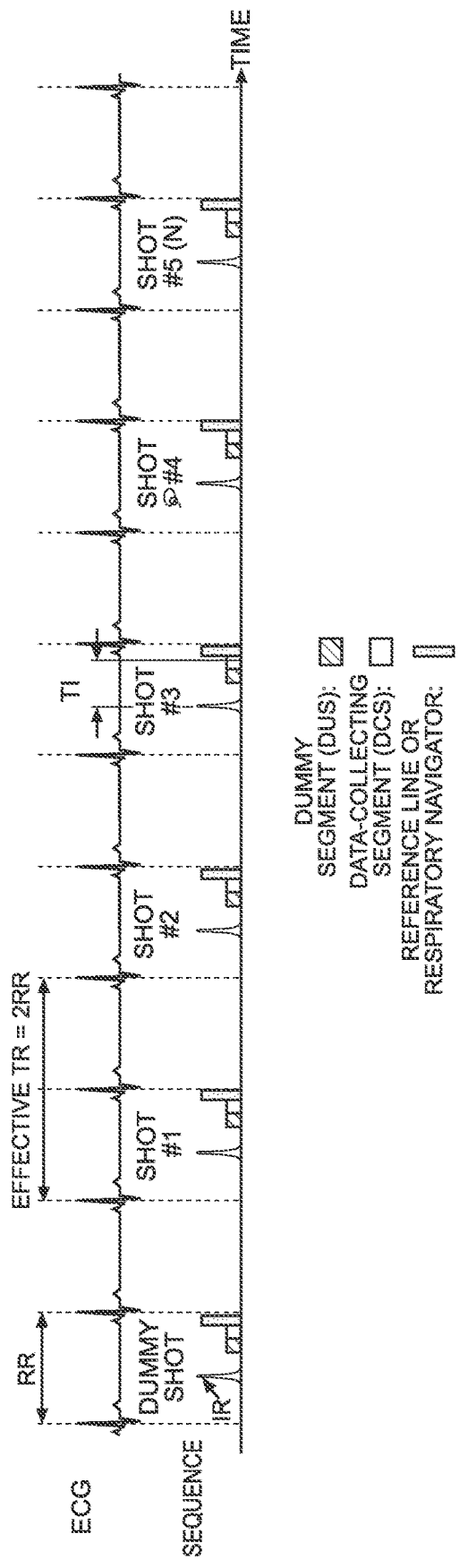
FIG. 16 shows an example according to FIG. 8 with the addition of a respiratory position reference line or respiratory navigator acquisition, according to example embodiments.

FIG. 16 shows another example of a PRC+DUS method wherein a position reference (POS REF) line or image, or a respiratory navigator is acquired immediately following the DCS, according to example embodiments.

Referring to FIG. 16, in some example embodiments, if the data is being captured while the patient is free breathing, an associated position reference (POS REF) line, image, or respiratory navigator (e.g., a respiratory navigator echo) can be acquired after each DCS. This additional information may be used to evaluate the similarity of the respiratory positions during which each segment is acquired.

In some example embodiments, based on POS REF lines or images, the same k-space segment may be acquired by multiple DCS (in different heartbeats) and only the DCS with the position best fitting to an optimal position reference image may be kept. For example, the same k-space segment may be acquired between 2 and 10 times (parameter 'measurements' between 2 and 10). The other DCS of that same k-space segment may be discarded. This is repeated for all k-space segments.

The scan duration is known ahead of the run time and equals the product of the number of shots (needed for one full k-space), the number of 'measurements' of each segment, the trigger pulse, and the average RR-interval. If using a leading dummy segment, RR-interval times the trigger pulse is added.

The optimal position reference image may be determined according to any known method. For example, all acquired POS REF lines or images of the scan may be averaged together and represent the optimal position reference image. Assuming the very common case that the majority of the respiratory cycle is spent in the end-expiratory position, this optimal position reference image, to first order, corresponds to end-expiratory phase. Comparison of POS REF lines or images to the optimal position reference image or line, or among each other, may be done by cross-correlation or simple subtraction in the image or k-space.

In other example embodiments, an optimal position reference image may be found during the first few seconds of a free-breathing scan based on all POS REF lines, images, or navigators acquired during that time. A first segment is then acquired repeatedly until the associated POS REF line, image, or navigator is within a defined range of the established optimal position reference image, line or navigator. This procedure is repeated for all other segments.

When replacing the POS REF line or image with a known respiratory navigator that tracks the dome of the liver, for example, the DCS for one segment is repeated until the dome of the liver is located inside an acceptance window (e.g., predetermined or given acceptance window). Then, the next segment is acquired.

The respiratory position for each segment should be similar but need not be exactly the same, because the PRC reordering scheme is motion robust. Thus, free-breathing scans can be acquired faster due to larger tolerances or a larger acceptance window than possible with INTR, where such relaxed parameters would cause artifacts.

Figure 17:
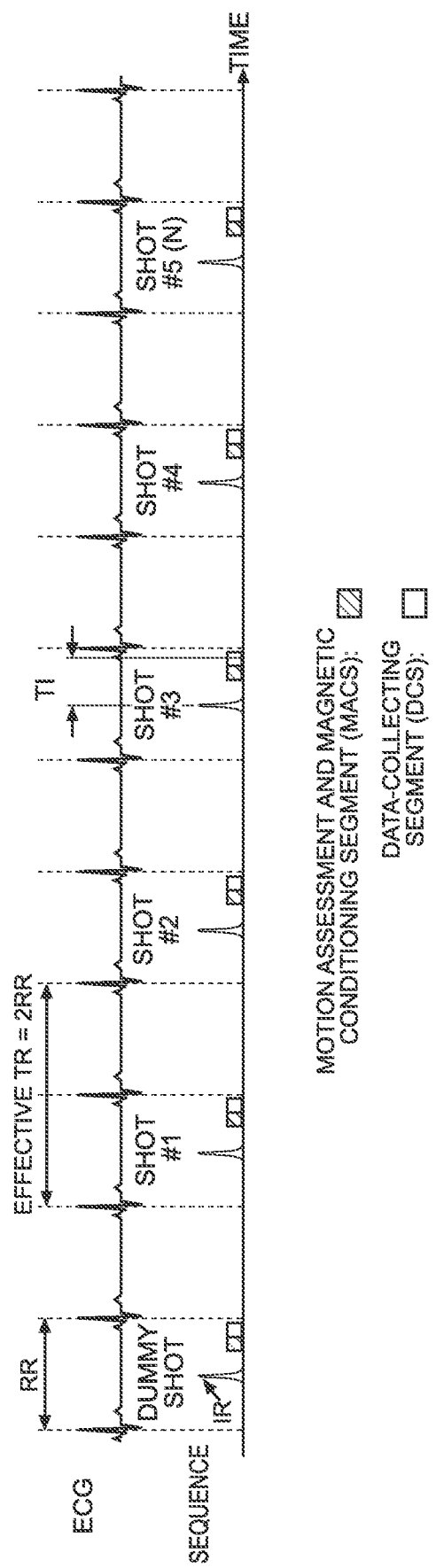
FIG. 17 shows an example according to FIG. 8 wherein the dummy segments (DUS) are replaced by motion assessment and magnetic conditioning segments (MACS) that perform the same magnetic conditioning as the DUS and additionally collect respiratory position reference images.

FIG. 17 shows an example of an alternate way of acquiring a POS REF image for each DCS of the PRC+DUS method.

Referring to FIG. 17, the DUS preceding each DCS can be used for respiratory position assessment instead of the POS REF line, image, or respiratory navigator according to FIG. 16. The DUS then becomes a motion assessment and magnetic conditioning segment (MACS). A low-PE resolution POS REF image may be acquired right before each DCS and simultaneously establish the steady state needed to flatten the modulation function.

To find the optimal DCS for each segment during free breathing, the same logic described above for both reference image or reference line-based embodiments can be applied to these POS REF images. Additionally, motion fields between any two POS REF images or between any POS REF image and the optimal position reference image can be calculated. The motion fields may be calculated according to any known method. These motion fields then enable a motion correction of the individual segments before combining them. Motion correction and combination of the individual segments will be explained in more detail with reference to FIG. 18.

The motion correction and combination of the individual segments is possible using the PRC reordering scheme, but not possible with INTR because each segment is contiguous for PRC and therefore has no aliasing, whereas INTR segments include aliasing. Motion correction may not be performed on images including aliasing.

In at least one example embodiment, all POS REF images may be averaged. Then, for each k-space segment, the POS REF image that is most similar to the average image may be found. The associated DCS, each for a separate k-space segment, may then be combined into one k-space.

In at least one example embodiment, all POS REF images may be averaged. Then an image, out of all POS REF images, that is most similar to the average may be determined. This image may be chosen as the optimal position reference image. Similarity can be determined by subtraction or cross-correlation of the POS REF images. Then, for each k-space segment, the POS REF image that is most similar to the optimal position reference image may be found. The associated DCS, each for a separate k-space segment, may then be combined into one k-space.

In at least one other example embodiment, the method is the same as discussed above, except in the last step each associated DCS may be placed in an otherwise zero-filled k-space. These partially filled k-spaces may be transformed into (complex) partial images that undergo a non-rigid motion-correction (MOCO), by applying a different correction field to each partial image. Each correction field may be derived from the reference image of each partial image and the optimal position reference image. The motion corrected partial images (complex data) are then added to create the final image.

Figure 18:
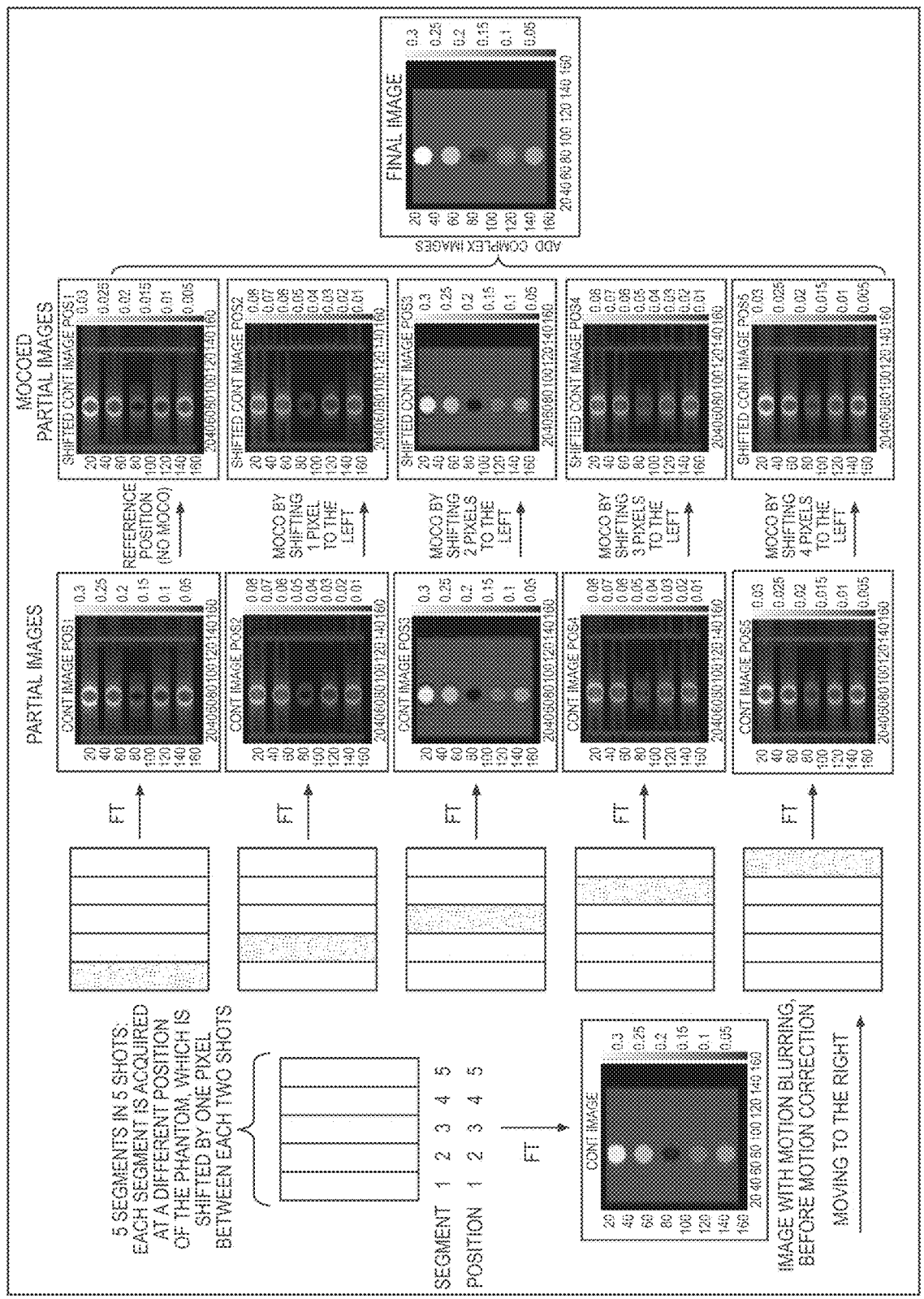
FIG. 18 shows an example of a method for motion-correcting and combining contiguous segments that were acquired with the PRC reordering scheme.

FIG. 18 shows an example of a method for motion correcting and combining segments.

Referring to FIG. 18 a simulated phantom may be shifted one pixel in PE-direction between each shot. In the example illustrated in FIG. 18, the first position when segment 1 was acquired is regarded as the reference position. No MOCO is needed for this segment.

Segment 2 is acquired when the phantom has shifted by one pixel relative to the reference position. This data is placed in an otherwise empty k-space and Fourier-transformed yielding a partial image (image in second row and second column).

The partial image undergoes a MOCO, which can be in both directions and be non-rigid. In the example shown in FIG. 18, only a one-pixel correction in PE direction is needed. Each of the remaining partial images experiences a different MOCO. All MOCOed partial images are combined (e.g., added) to create the final image.

The PRC and PRC+DUS schemes are fully compatible with a gradient echo (GRE) readout, its implementation as fast low angle shot (FLASH) readout, and a steady state free precession (SSFP) readout. IR-prepared SSFP requires a (linearly) ramped-up flip angle from zero degrees to the nominal readout flip angle of approximately ten dummy TRs at the beginning of the readout.

Figure 19A:
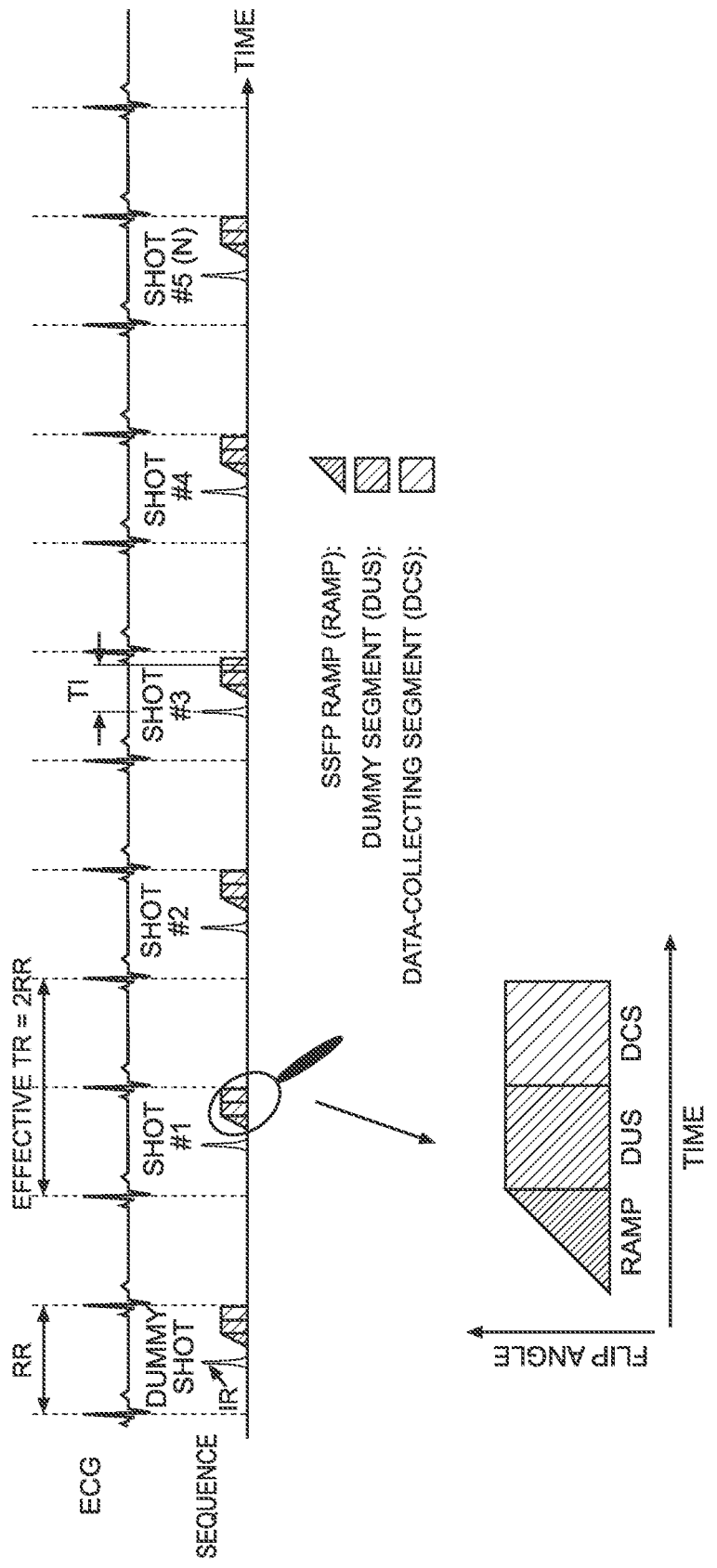
FIG. 19A shows an example of implementing PRC+DUS into a steady state free precession (SSFP) readout. The known flip angle ramp precedes the DUS.

FIG. 19A shows an example of implementing PRC+DUS into a SSFP readout.

Referring to FIG. 19A, when implementing PRC+DUS into a SSFP sequence, the DUS is played out after the standard SSFP flip angle ramp and before the DCS. The presented figures only showed simulations and images based on GRE, but the method produces even better IQ for SSFP since the ramp aides with keeping the steady state between segments even in the case of variable RR.

Figure 19B:
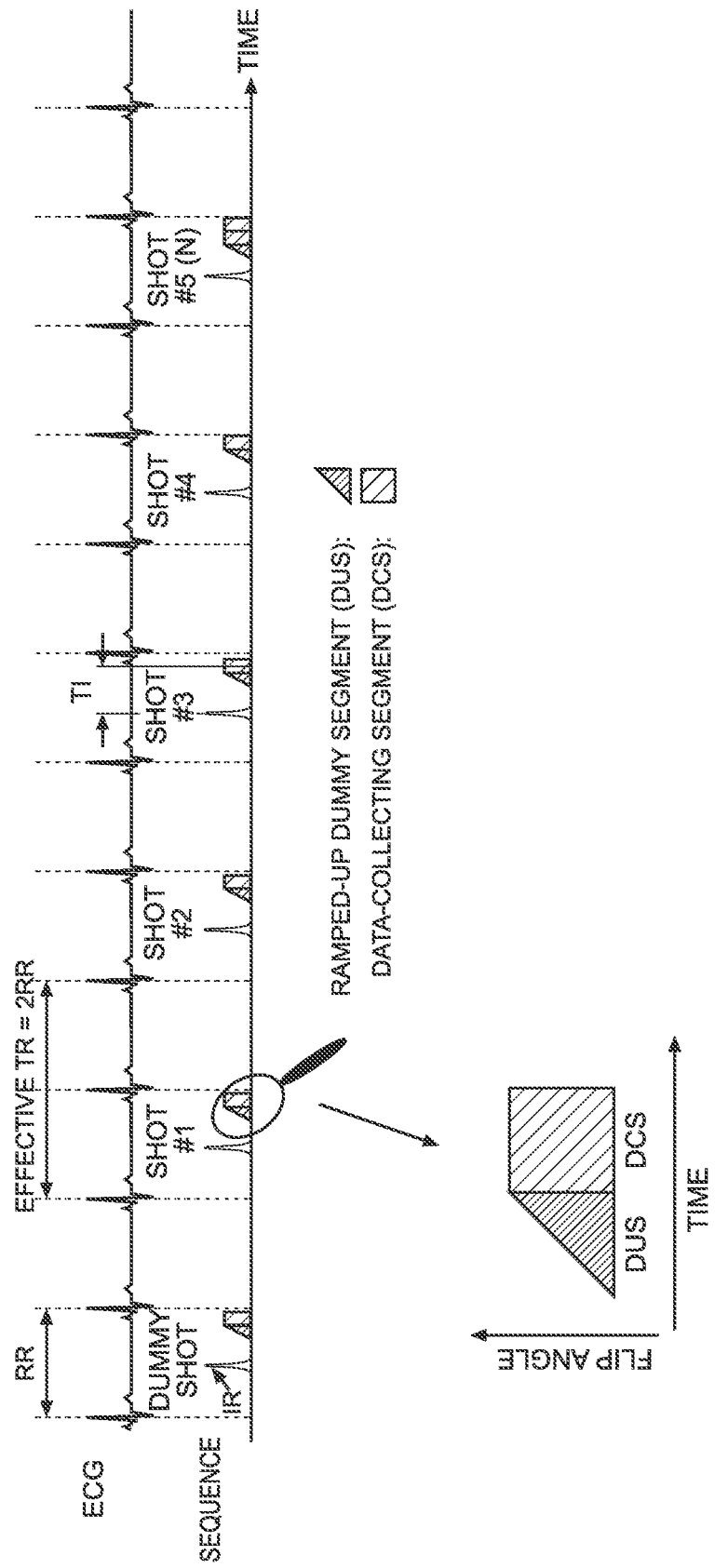
FIG. 19B shows another example of implementing PRC+DUS into a SSFP readout.

FIG. 19B shows another example of implementing PRC+DUS into an SSFP readout. In this example, the flip angle is ramped-up during the DUS.

Figure 19C:
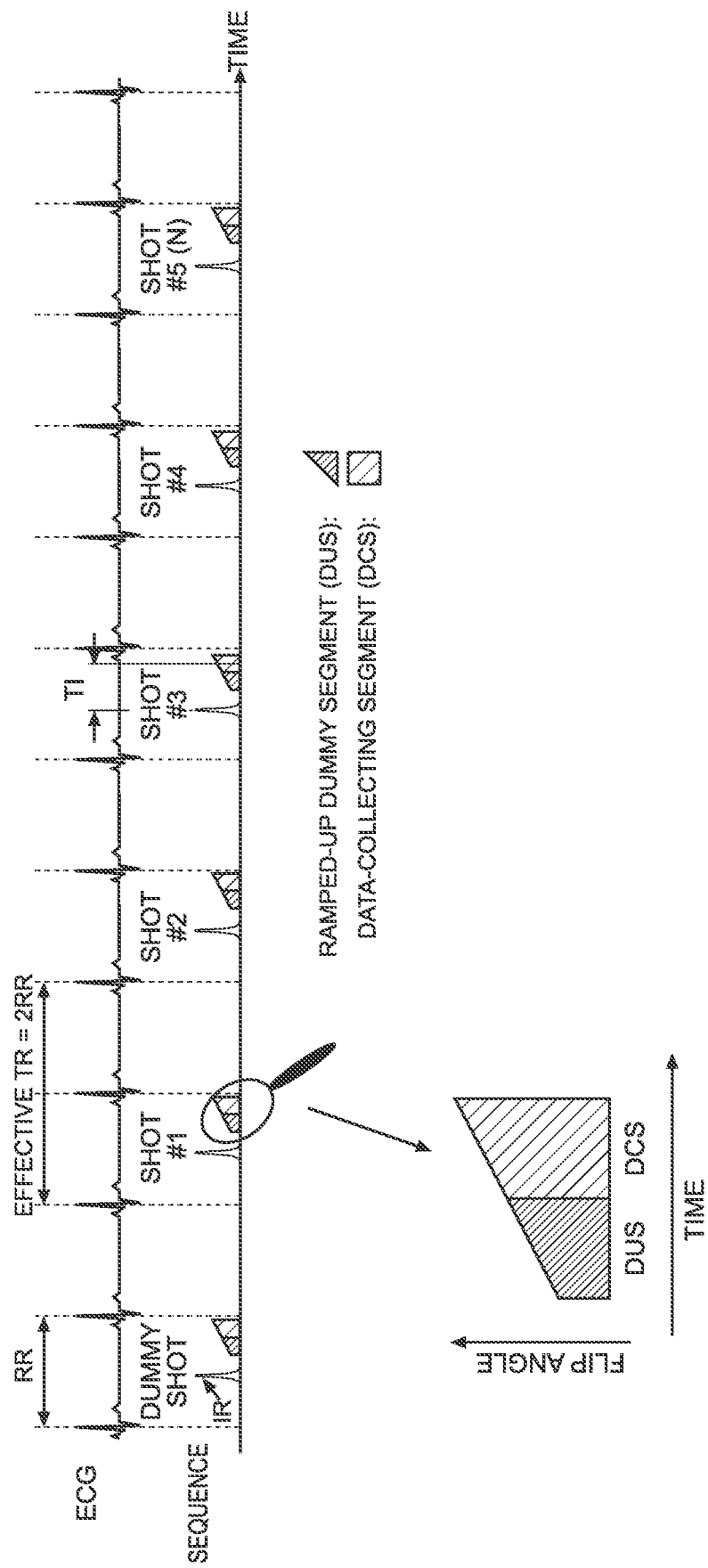
FIG. 19C shows an example of implementing PRC+DUS into a GRE readout.

FIG. 19C shows an example of implementing PRC+DUS into a GRE readout. In this example, the flip angle is ramped-up during the combined duration of DUS and DCS.

Figure 20A:
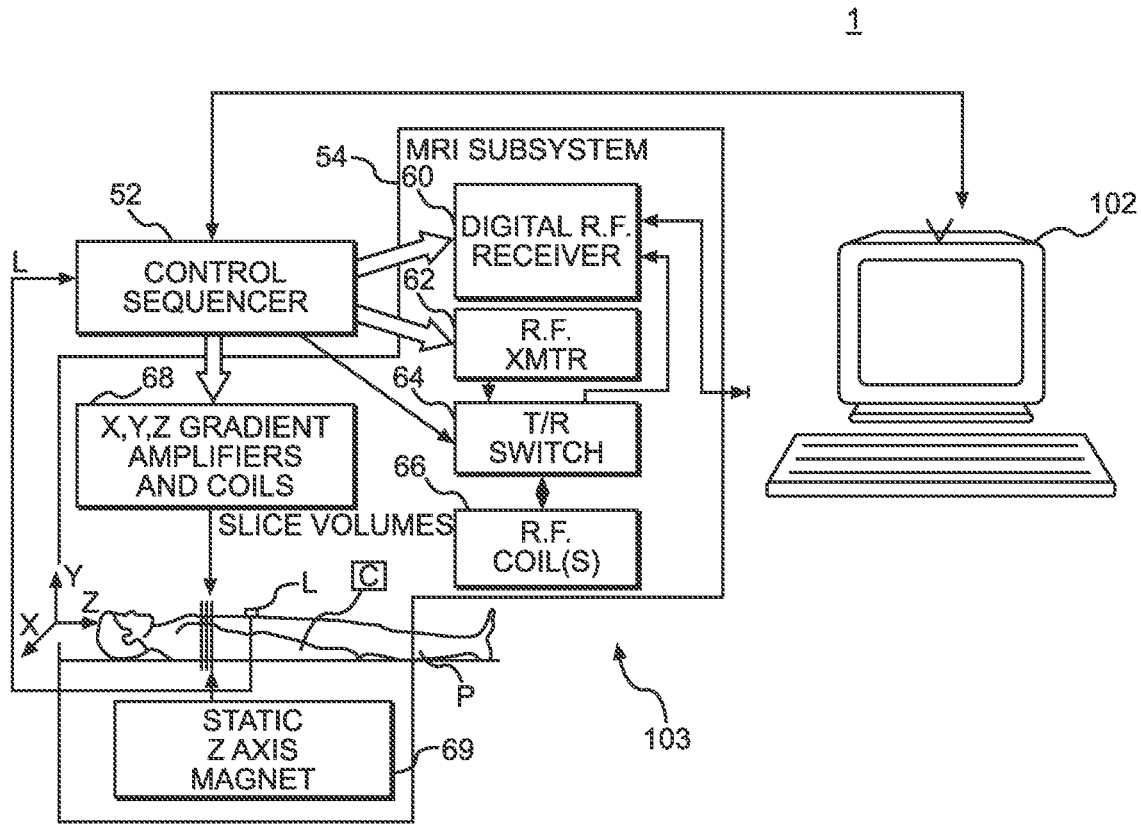
FIG. 20A is an illustration of a system for implementing methods according to example embodiments.

FIG. 20A is an illustration of a system for implementing methods according to example embodiments.

Figure 20B:
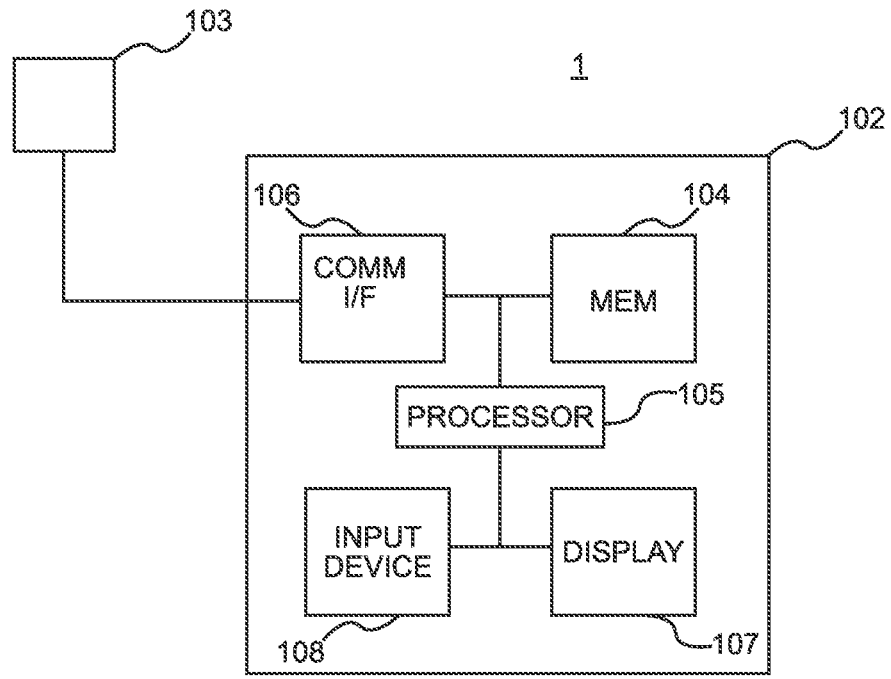
FIG. 20B is a block diagram illustrating an example embodiment of the system shown in FIG. 20A.

FIG. 20B is a block diagram illustrating an example embodiment of the system shown in FIG. 20A.

Referring to FIGS. 20A and 20B, a system 1 comprises an information processing device 102, and an acquisition device 103 including a MRI real-time control sequencer 52, and a MRI subsystem 54. MRI subsystem 54 includes XYZ magnetic gradient coils and associated amplifiers 68, a static Z-axis magnet 69, a digital RF transmitter 62, a digital RF receiver 60, a transmit/receive switch 64, and RF coil(s) 66. As is well known, a dedicated cardiac or torso phased-array coil is typically used for cardiac imaging. Electrocardiogram (ECG) leads L are used in cardiac imaging to synchronize control sequencer 52 with electrical stimulation of the heart by the brain.

Subsystem 54 is controlled in real time by sequencer 52 to generate magnetic and radio frequency fields that stimulate nuclear magnetic resonance ("NMR") phenomena in an object P (e.g., a human body) to be imaged.

The information processing device 102 implements a method for processing medical data, such as medical image data. In FIGS. 20A and 20B, the acquisition device 103 is shown as a separate unit from the information processing device 102. It is however possible to integrate the information processing device 102 as part of the acquisition device 103.

The information processing device 102 may include a memory 104, processing circuitry (such as at least one processor 105), a communication interface 106 and/or an input device 108. The memory 104 may include various special purpose program code including computer executable instructions which may cause the information processing device 102 to perform one or more of methods according to example embodiments. The acquisition device 103 may provide the medical data to the information processing device 102 via the communication interface 106.

Figure 21:
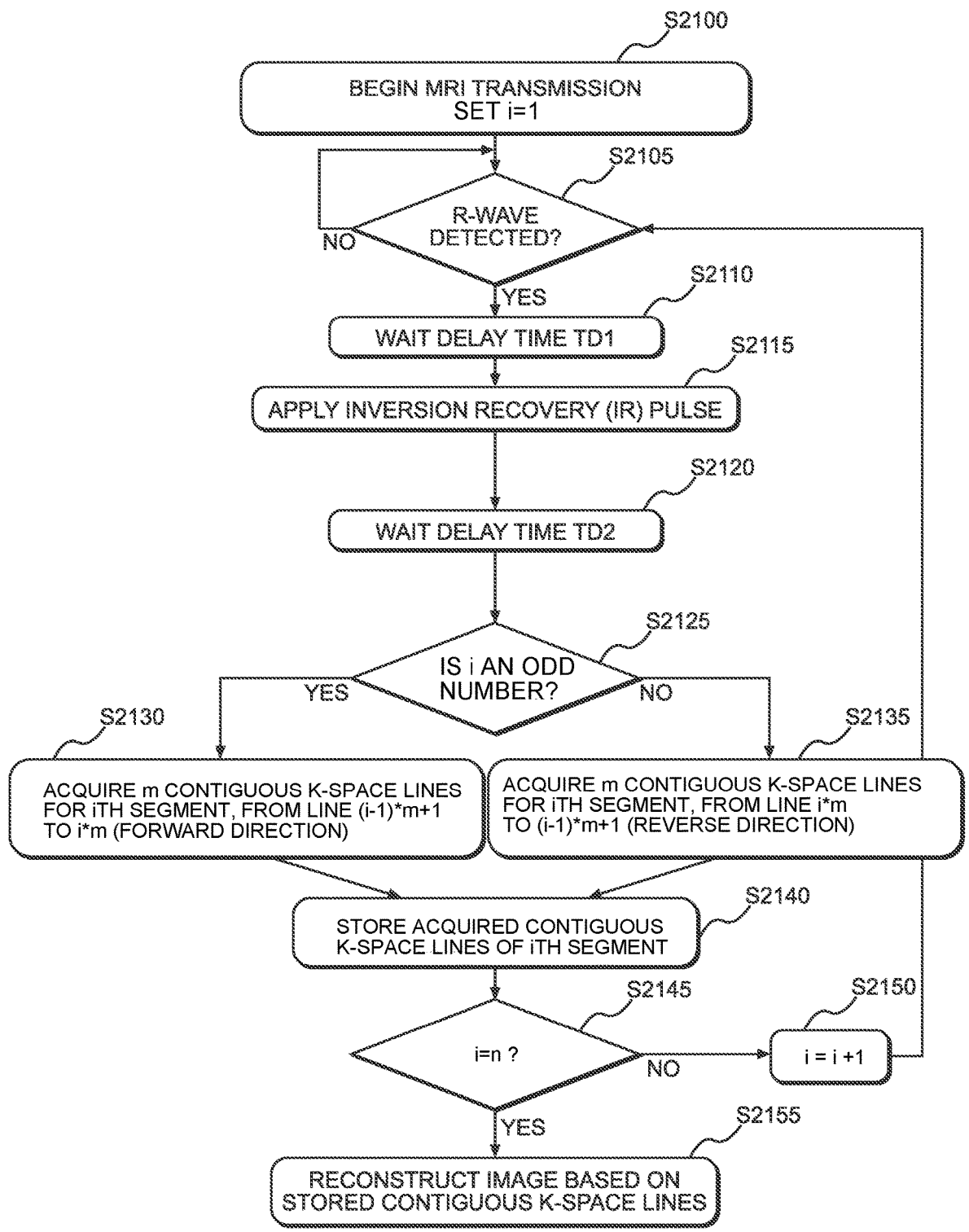
FIG. 21 is a flow chart illustrating a PRC method according to example embodiments.

FIG. 21 is a flow chart illustrating a PRC method according to example embodiments. For example purposes, the example embodiment shown in FIG. 21 will be discussed with regard to the system shown in FIGS. 20A and 20B. In at least this instance, it is understood that the processor 105 executing program code causes the information processing device 102 to perform the method of FIG. 21. However, example embodiments should not be limited to this example.

Referring to FIG. 21, at S2100 the information processing device 102 instructs the acquisition device 103 to begin MRI acquisition. For example, the information processing device 102 may instruct the acquisition device 103 to perform the acquisition according to any known method such as a gradient echo (GRE) sequence, a steady state free pression (SSFP) sequence, and/or a turbo-spin echo (TSE) sequence.

The information processing device 102 receives a signal from the acquisition device 103 based on stimulated nuclear magnetic resonance ("NMR") phenomena in the object P.

Also at S2100, the information processing device 102 may initialize variables for use during the acquisition. For example, the information processing device 102 may set a counter (e.g., a shot counter) value i equal to 1. The counter value i may be used to determine a direction (a forward direction or a reverse direction) for acquiring k-space lines.

Additionally, the information processing device 102 may set a variable n equal to a number of shots to be acquired and a variable m equal to a number of lines per shot. The number of shots n and the number of lines per shot m may be a function of the desired temporal resolution of the image to be acquired, which in turn depends on the patient's heart rate. The number of shots n results from the lines per shot m and the desired spatial resolution in the phase encoding direction, (i.e., the number of phase encoding steps). To first order, the number of shots n equals the number of phase encoding steps divided by the number of lines per shot m. Two out of the three variables, the number of phase encoding steps, m, and n, may be set by a user and define the value of the third variable.

At S2105, the information processing device 102 determines whether an R-wave of a patient's ECG signal is detected in the signal from the acquisition device 103.

If the information processing device 102 does not detect the R-wave (NO at S2105), then the information processing device 102 continues to monitor the signal from the acquisition device 103 until the information processing device 102 detects the R-wave.

If the information processing device 102 detects the R-wave (YES at S2105), then the information processing device 102 proceeds to S2110. Thus, at S2105, the information processing device 102 synchronizes to a physiologic signal of a heart or vessel. Alternatively or additionally, in some example embodiments, the information processing device 102 may synchronize to a respiratory signal, and/or to an external trigger source.

At S2110, the information processing device 102 waits for a delay time TD1. The information processing device 102 may determine the delay time TD1 based on an inversion time (TI), an acquisition window, an inversion recovery (IR) duration, and/or a data collecting segment duration (DCSD) of the acquisition device 103. For example, the information processing device 102 may determine the delay time TD1 according to Equation 1 shown below.

$$TD1 = \text{acquisition window} - IR \text{ duration} - TI - \tfrac{1}{2}DCSD \quad \text{Equation 1}$$

The TI may be a fixed value. For example, the TI may be selected and/or input by a user. For example, a user may select the TI by inputting a TI selection to the information processing device 102. Alternatively, the TI may be a predetermined (or, alternately, given) value.

The acquisition window starts immediately after the R-wave and ends immediately after acquiring the last line of a shot. By changing a duration of the acquisition window, a user can move the position of a shot within the RR interval and place it so that the shot occurs in the diastolic quiescent part of the cardiac cycle.

The data collecting segment duration (DCSD) is the time it takes to acquire one segment. It equals the lines per shot times the echo spacing. The echo spacing is the time needed to acquire one line in the raw data space (k-space). The IR duration is the duration of the inversion recovery (IR) radio frequency (RF) pulse, which is typically around 10 ms but can be as short as 1 ms and as long as 100 ms.

At S2115, the information processing device 102 applies an inversion recovery (IR) pulse according to an inversion preparation. For example, the inversion preparation may be a spatially non-selective IR pulse, a spatially selective IR pulse, a wideband IR pulse, a double-IR dark blood preparation, etc. The IR pulse may be used to invert magnetization in the imaged patient. The IR pulse may be used to create T1-contrast.

Also, in some example embodiments, the information processing device 102 may apply a magnetization transfer preparation before or after the inversion-preparation to produce a flow independent dark blood delated enhancement (FIDDLE) image. In some example embodiments, the information processing device 102 may apply a T2-preparation before or after the inversion-preparation to produce a FIDDLE image.

At S2120, the information processing device 102 waits for a delay time TD2. The information processing device 102 may determine the delay time TD2 based on the TI and the DCSD. For example, the information processing device 102 may determine the delay time TD2 according to Equation 2 shown below.

$$TD2 = TI - \frac{1}{2}DCSD \qquad \text{Equation 2}$$

At S2125, the information processing device 102 determines whether the value of the shot counter i is an odd number. If the value of the shot counter i is an odd number (YES at S2125), then the information processing device 102 proceeds to S2130.

At S2130, the information processing device 102 acquires, via the transmission from the acquisition device 103, m contiguous k-space lines for the ith segment. The m contiguous k-space lines may be referred to as a data collecting segment (DCS). The information processing device 102 may acquire the m contiguous k-space lines in the forward direction. For example, the information processing device may acquire the m contiguous k-space lines in order from line (i−1)*m+1 to line i*m. An example of DCS acquired at S2130 are shown in FIG. 6, described above. The information processing device 102 then proceeds to S2140.

At S2140, the information processing device 102 stores the acquired m contiguous k-space lines of the ith segment.

At S2145, the information processing device 102 determines whether n shots have been executed. For example, the information processing device may determine that n shots have been executed in response to determining that the value of the shot counter i equals the number of shots n. If the information processing device 102 determines that n shots have not been executed (NO at S2145), then the information processing device 102 proceeds to S2150.

At S2150, the information processing device 102 increments the shot counter i by 1. The information processing device 102 then returns to S2105 and continues as discussed herein.

Returning to S2145, if the information processing device 102 determines that n shots have been executed (YES at S2145), then the information processing device 102 proceeds to S2155.

At S2155, the information processing device 102 reconstructs one or more images based on the stored contiguous k-space lines. The information processing device 102 may reconstruct the one or more images in any known manner.

Returning now to S2125, if the information processing device 102 determines that shot counter i is not an odd number (NO at S2125), then the information processing device 102 proceeds to S2135.

At S2135, the information processing device 102 acquires, via the transmission from the acquisition device 103, m contiguous k-space lines in a reverse direction. As mentioned above, the m contiguous k-space lines may be referred to as DCS. For example, the information processing device 102 may acquire the m contiguous k-space lines in reverse order beginning from line i*m through line (i−1) *m+1. The information processing device 102 then proceeds to S2140 and continues as discussed herein.

For example, as a result of the above-described method of FIG. 21, according to example embodiments, the information processing device 102 may acquire m k-space lines at a time, alternating between acquiring the m k-space lines in the forward direction and acquiring the m k-space lines in the reverse direction.

Figure 22:
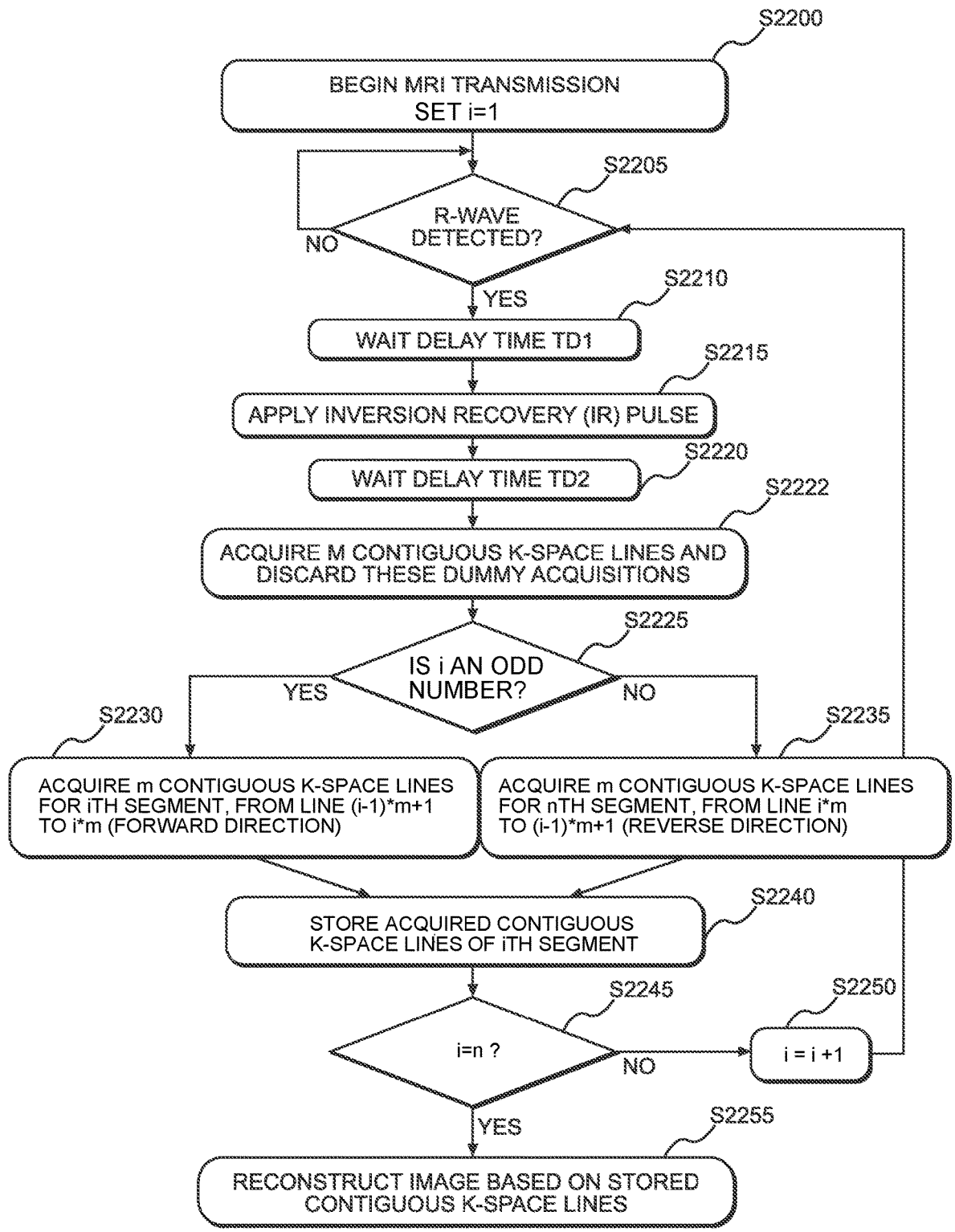
FIG. 22 is a flow chart illustrating a PRC+DUS method according to the example embodiment in FIG. 8.

FIG. 22 is a flow chart illustrating a PRC+DUS method according to example embodiments. For example purposes, the example embodiment shown in FIG. 22 will be discussed with regard to the system shown in FIGS. 20A and 20B. In at least this instance, it is understood that the processor 105 executing program code causes the information processing device 102 to perform the method of FIG. 22. However, example embodiments should not be limited to this example.

Referring to FIGS. 22, S2200, S2205, S2210, S2215, S2220, S2225, S2230, S2235, S2240, S2245, S2250, and S2255 may correspond, respectively, with S2100, S2105, S2110, S2115, S2120, S2125, S2130, S2135, S2140, S2145, S2150, and S2155. Repeated description is therefore omitted.

In this example embodiment, after waiting the delay time TD2 at S2220, the information processing device 102 may, different from S2120, proceed to S2222.

Note that TD1 is calculated identically for PRC (FIG. 21) and PRC+DUS (FIG. 22), but that TD2 is calculated differently for PRC+DUS shown below:

$$TD2 = TI - \frac{1}{2}DCSD - DUSD \qquad \text{Equation 3}$$

DUSD, in Equation 3, is the dummy segment duration.

At S2222, the information processing device 102 acquires dummy k-space lines (dummy lines). For example, the information processing device 102 may acquire the same number of lines (m) as the immediately following data collecting segment (DCS), with all parameters, such as TR and/or flip angle the same as in the DCS.

Alternatively, the information processing device 102 may acquire fewer than m TR intervals (PE lines) and increase the flip angle of each to create a similar magnetic saturation as in the basic form, thereby saving time and/or being more flexible with the minimum user-selectable TI. For example, the information processing device 102 may acquire l dummy segments with 1<m. The flip angle of the dummy segments may be equal to the original flip angle multiplied with the ratio m/l.

In some example embodiments, the information processing device 102 may use an increasing ("ramped") or decreasing flip angle during the dummy segment TRs. This may result in the same net magnetic saturation effects but save time and/or have fewer image artifacts.

For example, the dummy segment may be acquired using an increasing flip angle, linearly increased from a starting flip angle to an ending flip angle used for acquiring the DCS. For example, a gradient echo readout may start at a flip angle of 5 degrees with the 1st pulse, increasing by 1 degree for each consecutive pulse, and ending at a flip angle of 20 degrees with the 16th pulse. The linear increase could also be replaced with another increasing function such as of sine or exponential nature.

According to example embodiments, the information processing device 102 may acquire one dummy segment per DCS. An example of a gradient echo PRC+DUS using an increasing flip angle during the DUS acquisition is shown in FIG. 19B. An example of a gradient echo PRC+DUS using an increasing flip angle during the DUS and the DCS is shown in FIG. 19C.

Alternatively, the dummy segment may be acquired using a decreasing flip angle starting with a flip angle that is larger than the flip angle used for acquiring the DCS.

The information processing device 102 may use the dummy segments to place the system between the transient and the steady-state, so that the contrast generation by T1-recovery is preserved but the slope of the modulation function is reduced, and any modulation discontinuities caused by variable RR-intervals are lessened to such a degree that artifacts are no longer visible.

Also at S2222, the information processing device 102 discards the m dummy lines. An example of dummy segments acquired at S2222 are shown in FIGS. 7-8, described above. The information processing device 102 then proceeds to S2225 and continue as discussed herein.

Figure 23:
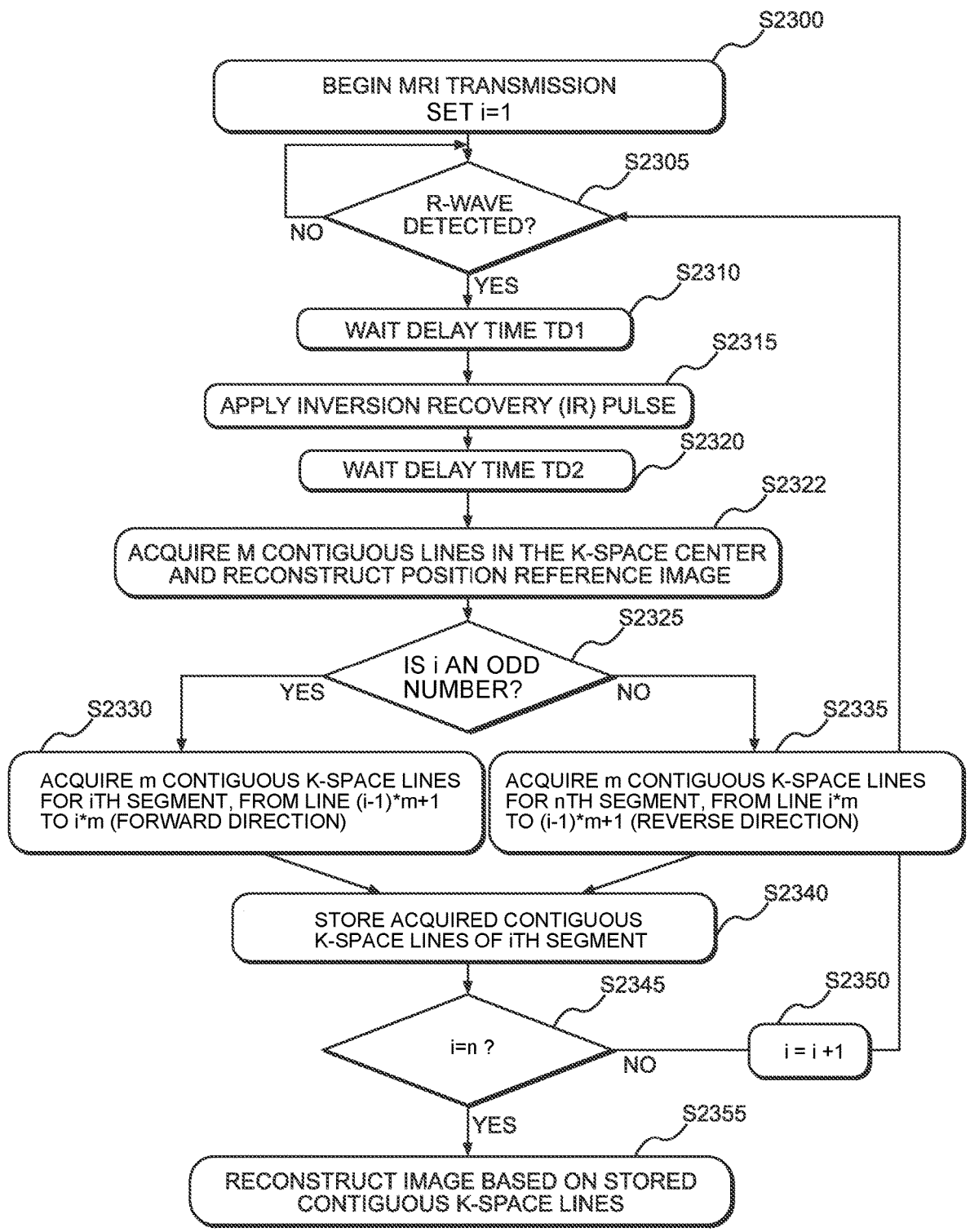
FIG. 23 is a flow chart illustrating a PRC+MACS method according to the example embodiment in FIG. 17.

FIG. 23 is a flow chart illustrating a method according to example embodiments.

For example purposes, the example embodiment shown in FIG. 23 will be discussed with regard to the system shown in FIGS. 20A and 20B. In at least this instance, it is understood that the processor 105 executing program code causes the information processing device 102 to perform the method of FIG. 23. However, example embodiments should not be limited to this example.

Referring to FIGS. 23, S2300, S2305, S2310, S2315, S2320, S2325, S2330, S2335, S2340, S2345, S2350, and S2355 may correspond, respectively, with S2100, S2105, S2110, S2115, S2120, S2125, S2130, S2135, S2140, S2145, S2150, and S2155. Repeated description is therefore omitted.

In this example embodiment, after waiting the delay time TD2 at S2320, the information processing device 102, different from S2120, proceeds to S2322.

At S2322, the information processing device 102 acquires m contiguous lines in the k-space center. This is the acquisition of the motion assessment and magnetic conditioning segment (MACS) described before. The information processing device 102 then reconstructs a POS REF image based on the m contiguous lines in the k-space center.

For example, the information processing device 102 may reconstruct each motion assessment and magnetic conditioning segment MACS into a POS REF image. The information processing device 102 may use the POS REF images, each associated with a DCS acquired during the same shot, to calculate a set of n DCS that covers all m k-space segments while simultaneously having associated POS REF images that are as similar to an optimal position reference image as possible. Operations of the information processing device 102 performing S2322 are described above in more detail with reference to FIGS. 14-18.

Returning to FIG. 23, the process then proceeds to S2325 and continues as discussed herein.

Although the present invention has been described in detail with reference to example embodiments, the present invention is not limited by the disclosed examples from which the skilled person is able to derive other variations without departing from the scope of the invention.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The terminology used herein is for the purpose of describing particular embodiments only and is not intended to be limiting of example embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific structural and functional details disclosed herein are merely representative for purposes of describing example embodiments. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, at least one central processing unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

For example, when a hardware device is a computer processing device (e.g., a processor, Central At least one processor (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. According to one or more example embodiments, at least one memory may include or store computer program code, and the at least one memory and the computer program code may be configured to, with at least one processor, cause an information processing device and/or an acquisition device to perform the necessary tasks. Additionally, the processor, memory and example algorithms, encoded as computer program code, serve as means for providing or causing performance of operations discussed herein.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

What is claimed is:

1. A method for reordering k-space data acquired with a segmented MRI pulse sequence, the method comprising:
    synchronizing to a physiologic signal of a heart or vessel, to a respiratory signal, or to an external trigger source; and
    acquiring a plurality of data collecting segments each as a contiguous block in a phase encoding direction such that lines of the plurality of data collecting segments are alternately acquired in a forward direction, wherein the lines are acquired in order from a first line to last line, and a reverse direction, wherein the lines are acquired in order from the last line to the first line, for each consecutive data collecting segment,
    wherein the plurality of data collecting segments covers all k-space locations.

2. The method of claim 1, further comprising:
    acquiring a dummy segment prior to acquiring each data collecting segment using a same timing and flip angle as for the data collecting segment; and
    discarding the dummy segment.

3. The method of claim 2, wherein the acquiring the dummy segment includes acquiring the dummy segment such that a flip angle of the dummy segment equals the flip angle of the data collecting segment multiplied by the ratio of a number of lines of the data collecting segment to a number of lines of the dummy segment.

4. The method of claim 2, wherein the acquiring the dummy segment includes using an increasing flip angle ending at a flip angle used for acquiring the plurality of data collecting segments.

5. The method of claim 2, wherein the acquiring the dummy segment includes using a decreasing flip angle starting from a flip angle that is larger than a flip angle used for acquiring the plurality of data collecting segments.

6. The method of claim 1, further comprising:
    acquiring a respiratory navigator echo.

7. The method of claim 1, further comprising:
    acquiring a motion assessment and magnetic conditioning segment (MACS) prior to acquiring each data collecting segment using a same timing and flip angle as for the data collecting segment;
    reconstructing each MACS into a position reference image; and
    associating each data collecting segment of the plurality of data collecting segments with a position reference image acquired in a same shot as the respective data collecting segment.

8. The method of claim 7, wherein the acquiring the plurality of data collecting segments includes:
    acquiring a data collecting segment of the plurality of data collecting segments R times for each of N locations in k-space, where R is greater than 1 and less than 10 and N*R data collecting segments are acquired in total;
    comparing all N*R position reference images associated with the N*R data collecting segments to an optimal position reference image;

for each of the R data collecting segments of a first k-space location, determining one data collecting segment associated with a minimum difference between the associated position reference image and the optimal position reference image;

repeating the determining the one data collecting segment for all other k-space locations; and discarding remaining N*(R−1) out of the N*R data collecting segments.

9. The method of claim 8, further comprising:
determining the optimal position reference image as an average of all acquired position reference images.

10. The method of claim 8, further comprising:
determining the optimal position reference image by
calculating an average image of all acquired position reference images and creating subtraction images by subtracting the average image from each acquired position reference image,
calculating a pixel sum for each subtraction image to obtain a pixel sum difference for each position reference image, and
determining a position reference image associated with a minimum pixel sum difference as the optimal position reference image.

11. The method of claim 8, further comprising:
obtaining a motion correction field for each data collecting segment of the plurality of data collecting segments based on the associated position reference image and the optimal position reference image;
placing each data collecting segment that has not been discarded in a zero-filled k-space;
transforming the k-space into a partial image of complex pixel values;
performing a motion correction on the partial image by applying the associated motion correction field; and
creating a final motion corrected image by combining a plurality of motion corrected partial images.

12. The method of claim 7, wherein the acquiring the plurality of data collecting segments includes:
acquiring a first data collecting segment of the plurality of data collecting segments for S seconds;
creating an optimal position reference image for all data collecting segments by averaging all associated position reference images of the first data collecting segment;
determining a first data collecting segment associated with a smallest difference between the associated position reference image and the optimal position reference image;
discarding all other data collecting segments;
repeating the acquiring each data collecting segment until a difference between the associated position reference image and the optimal position reference image is below a threshold; and
ending the acquiring in response to all segments being acquired.

13. The method of claim 7, wherein the acquiring follows long-term averaging.

14. The method of claim 7, wherein the acquiring follows short-term averaging.

15. The method of claim 7, wherein the acquiring includes using a gradient echo sequence to acquire the plurality of data collecting segments and the plurality of MACS.

16. The method of claim 7, wherein the acquiring includes using a steady state free pression sequence to acquire the plurality of data collecting segments and the plurality of MACS.

17. The method of claim 7, wherein the acquiring includes using a turbo-spin echo sequence to acquire the plurality of data collecting segments and the plurality of MACS.

18. The method of claim 1, wherein an inversion preparation is a spatially non-selective inversion recovery pulse.

19. The method of claim 1, wherein an inversion-preparation is a spatially selective inversion recovery pulse.

20. The method of claim 1, wherein an inversion-preparation is a wideband inversion recovery pulse.

21. The method of claim 1, wherein an inversion-preparation is a double-IR dark-blood preparation.

22. The method of claim 1, further comprising:
applying a magnetization transfer preparation before or after an inversion-preparation to produce a flow independent dark blood delated enhancement (FIDDLE) image.

23. The method of claim 1, further comprising:
applying a T2-preparation before or after an inversion-preparation to produce a flow independent dark blood delated enhancement (FIDDLE) image.

24. A method for providing a segmented MRI pulse sequence configured to acquire inversion recovery prepared data and reference data for reconstructing a phase sensitive inversion recovery (PSIR) image, the method comprising:
acquiring the inversion recovery prepared data by acquiring a plurality of data collecting segments as a contiguous block in a phase encoding direction such that lines of the plurality of data collecting segments are alternately acquired in a forward order and a reverse order for each consecutive data collecting segment; and
acquiring the reference data without magnetic preparation.

* * * * *